(12) United States Patent
Lu et al.

(10) Patent No.: US 11,854,489 B2
(45) Date of Patent: Dec. 26, 2023

(54) DISPLAY SUBSTRATE AND MANUFACTURING METHOD THEREOF, AND DISPLAY DEVICE

(71) Applicant: BOE TECHNOLOGY GROUP CO., LTD., Beijing (CN)

(72) Inventors: Jiangnan Lu, Beijing (CN); Can Zheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 149 days.

(21) Appl. No.: 17/610,043

(22) PCT Filed: Jan. 13, 2021

(86) PCT No.: PCT/CN2021/071568
§ 371 (c)(1),
(2) Date: Nov. 9, 2021

(87) PCT Pub. No.: WO2022/151082
PCT Pub. Date: Jul. 21, 2022

(65) Prior Publication Data
US 2023/0162684 A1 May 25, 2023

(51) Int. Cl.
*G09G 5/00* (2006.01)
*G09G 3/3266* (2016.01)
*G11C 19/28* (2006.01)
*H10K 59/131* (2023.01)

(52) U.S. Cl.
CPC ........... *G09G 3/3266* (2013.01); *G11C 19/28* (2013.01); *H10K 59/131* (2023.02); *G09G 2300/0852* (2013.01); *G09G 2310/0286* (2013.01)

(58) Field of Classification Search
CPC ... G09G 2300/0413; G09G 2300/0426; G09G 2300/0819; G09G 2310/0232; G09G 2310/0267; G09G 2310/0281; G09G 2310/0283; G09G 2310/0286; G09G 3/3208; G09G 3/3225; H10K 59/12
See application file for complete search history.

(56) References Cited

U.S. PATENT DOCUMENTS

2006/0022201 A1* 2/2006 Kim ....................... G02F 1/1339
438/151
2018/0190190 A1* 7/2018 Xi ......................... G09G 3/3208

* cited by examiner

*Primary Examiner* — Insa Sadio
(74) *Attorney, Agent, or Firm* — Collard & Roe, P.C.

(57) ABSTRACT

A display substrate, a manufacturing method thereof and a display device are provided. The display substrate includes a base substrate, and a shift register unit, a first clock signal line and a second clock signal line which are on the peripheral region of the base substrate; the first clock signal line and the second clock signal line extend along a first direction; an active layer of the first control transistor, an active layer of the second control transistor, and an active layer of the third control transistor respectively extend along a second direction, and the active layer of the first control transistor, the active layer of the second control transistor, and the active layer of the third control transistor are on a side of the first clock signal line and the second clock signal line close to the display region, and are arranged side by side in the first direction.

20 Claims, 7 Drawing Sheets

DISPLAY SUBSTRATE AND MANUFACTURING METHOD THEREOF, AND DISPLAY DEVICE

CROSS REFERENCE TO RELATED APPLICATIONS

This application is the National Stage of PCT/CN2021/071568 filed on Jan. 13, 2021, the disclosure of which is incorporated by reference.

TECHNICAL FIELD

The embodiments of the present disclosure relate to a display substrate and a manufacturing method thereof, and a display device.

BACKGROUND

In a field of display technology, for example, a pixel array of a liquid crystal display panel or an organic light-emitting diode (OLED) display panel generally comprises a plurality of rows of gate lines and a plurality of columns of data lines, the plurality of rows of gate lines are interlaced with the plurality of columns of data lines. The driving of the gate lines can be achieved by a bonded integrated driving circuit. In recent years, with continuous improvement of a manufacturing process of amorphous silicon thin film transistors or oxide thin film transistors, the gate drive circuit can also be directly integrated on a thin film transistor array substrate to form a GOA (Gate-driver On Array) to drive the gate lines. For example, a GOA composed of a plurality of cascaded shift register units may be used to provide on-off state voltage signals (scan signals) for the plurality of rows of gate lines of the pixel array, thereby, for example, controlling the plurality of rows of gate lines to be sequentially turned on, and at the same time, data signals are provided to pixel units of a corresponding row in the pixel array through the data lines, therefore, gray voltages required for respective gray scales of a display image in respective pixel units are generated, furthermore a frame image is displayed.

SUMMARY

At least one embodiment of that present disclosure provide a display substrate, comprising: a base substrate, comprising a display region and a peripheral region on at least one side of the display region; and a shift register unit, a first clock signal line, and a second clock signal line, on the peripheral region of the base substrate; the first clock signal line and the second clock signal line extend along a first direction on the base substrate, and the first clock signal line and the second clock signal line are configured to respectively provide a first clock signal or a second clock signal to the shift register unit; the shift register unit comprises a first control transistor, a second control transistor, and a third control transistor; an active layer of the first control transistor, an active layer of the second control transistor, and an active layer of the third control transistor respectively extend along a second direction that is different from the first direction; an orthographic projection of the active layer of the first control transistor on the base substrate, an orthographic projection of the active layer of the second control transistor on the base substrate, and an orthographic projection of the active layer of the third control transistor on the base substrate are on a side of orthographic projections of the first clock signal line and the second clock signal line on the base substrate close to the display region; a minimum distance in the second direction between the orthographic projection of the active layer of the first control transistor on the base substrate and the orthographic projections of the first clock signal line and the second clock signal line on the base substrate is a first distance; a minimum distance in the second direction between the orthographic projection of the active layer of the second control transistor on the base substrate and the orthographic projections of the first clock signal line and the second clock signal line on the base substrate is a second distance; a minimum distance in the second direction between the orthographic projection of the active layer of the third control transistor on the base substrate and the orthographic projections of the first clock signal line and the second clock signal line on the base substrate is a third distance; a difference between the first distance and the second distance is greater than or equal to 0 and is less than or equal to a size of the active layer of the first control transistor in the second direction or a size of the active layer of the second control transistor in the second direction; a difference between the first distance and the third distance is greater than or equal to 0 and is less than or equal to 2 times the size of the active layer of the first control transistor in the second direction or 2 times a size of the active layer of the third control transistor in the second direction; and a difference between the second distance and the third distance is greater than or equal to 0 and is less than or equal to 2 times the size of the active layer of the second control transistor in the second direction or 2 times the size of the active layer of the third control transistor in the second direction.

For example, in the display substrate provided by an embodiment of the present disclosure, a range of the first distance is 40 μm~55 μm, and a range of the second distance is 40 μm~55 μm.

For example, in the display substrate provided by an embodiment of the present disclosure, the first distance is 40 μm, 42 μm, 44 μm, 45 μm, or 50 μm, and the second distance is 40 μm, 42 μm, 44 μm, 45 μm, or 50 μm.

For example, in the display substrate provided by an embodiment of the present disclosure, a gate electrode of the first control transistor, a gate electrode of the second control transistor, and a gate electrode of the third control transistor are parallel to each other in the first direction.

For example, in the display substrate provided by an embodiment of the present disclosure, the gate electrode of the first control transistor comprises a main body portion extending along the second direction and two sub-gate electrodes, which are parallel to each other, extending from the main body portion of the gate electrode of the first control transistor; and the gate electrode of the second control transistor comprises a main body portion extending along the second direction and two sub-gate electrodes, which are parallel to each other, extending from the main body portion of the gate electrode of the second control transistor.

For example, in the display substrate provided by an embodiment of the present disclosure, the orthographic projection of the active layer of the third control transistor on the base substrate is on a side of the orthographic projection of the active layer of the second control transistor on the base substrate away from the orthographic projection of the active layer of the first control transistor on the base substrate.

For example, in the display substrate provided by an embodiment of the present disclosure, the shift register unit comprises an input circuit, a first node control circuit, a second node control circuit, a second node noise reduction circuit, a third node control circuit, an output control circuit, and an output circuit; the first node control circuit is configured to input a first voltage to a first node under control of an input signal and the second clock signal; the second node control circuit is configured to input the first clock signal to a second node in response to a level of the first node; the output control circuit is configured to output the first voltage to an output terminal in response to a level of the second node; the input circuit is configured to input the input signal to a fourth node in response to the first clock signal; the second node noise reduction circuit is configured to input the first voltage to the second node in response to a level of the fourth node, so as to perform noise reduction on the second node; the third node control circuit is configured to control a level of a third node under control of a second voltage; and the output circuit is configured to output the second voltage to the output terminal in response to the level of the third node, the first node control circuit comprises the first control transistor and the second control transistor, and the second node control circuit comprises the third control transistor.

For example, the display substrate provided by an embodiment of the present disclosure, further comprises a first connection wire; the first connection wire extends along the second direction, and an orthographic projection of the first connection wire on the base substrate is on a side of an orthographic projection of a gate electrode of the second control transistor on the base substrate away from the display region; a first end of the first connection wire is connected to the gate electrode of the second control transistor, and a second end of the first connection wire is connected to the second clock signal line through a hole penetrating an insulating layer; and the first connection wire and the gate electrode of the second control transistor are integrally formed.

For example, the display substrate provided by an embodiment of the present disclosure, further comprises a first transfer electrode; the first transfer electrode comprises a first sub-portion extending along the first direction; and a first end of the first sub-portion of the first transfer electrode is connected to a second electrode of the first control transistor, and a second end of the first sub-portion of the first transfer electrode is connected to a second electrode of the second control transistor.

For example, the display substrate provided by an embodiment of the present disclosure, further comprises a first power line that provides the first voltage and a first power line transfer electrode; the first power line extends along the first direction, an orthographic projection of the first power line on the base substrate is on a side of the orthographic projection of the active layer of the first control transistor on the base substrate and the orthographic projection of the active layer of the second control transistor on the base substrate close to the display region; the first power line transfer electrode and the first power line are connected to each other and are formed integrally; and a first electrode of the first control transistor and a first electrode of the second control transistor are respectively connected to the first power line through the first power line transfer electrode.

For example, in the display substrate provided by an embodiment of the present disclosure, a ratio between a width of the first power line in the second direction and a width of the first clock signal line in the second direction is greater than or equal to 1.2 and less than or equal to 3; and a ratio between the width of the first power line in the second direction and a width of the second clock signal line in the second direction is greater than or equal to 1.2 and less than or equal to 3.

For example, the display substrate provided by an embodiment of the present disclosure, further comprises a second transfer electrode; an orthographic projection of the second transfer electrode on the base substrate is on a side of the orthographic projection of the active layer of the first control transistor on the base substrate and the orthographic projection of the active layer of the second control transistor on the base substrate away from the display region; the second transfer electrode extends along the first direction and is connected to a gate electrode of the first control transistor through a hole penetrating an insulating layer; and the second transfer electrode is connected to a trigger signal line or an output terminal of a previous stage of shift register unit to receive the input signal.

For example, in the display substrate provided by an embodiment of the present disclosure, the output circuit comprises an output transistor, and the output control circuit comprises an output control transistor; an orthographic projection of an active layer of the output transistor on the base substrate and an orthographic projection of an active layer of the output control transistor on the base substrate are on a side of the orthographic projection of the active layer of the first control transistor on the base substrate and the orthographic projection of the active layer of the second control transistor on the base substrate close to the display region, and is on a side of the orthographic projection of the first power line on the base substrate away from the display region.

For example, the display substrate provided by an embodiment of the present disclosure, further comprises at least one common semiconductor pattern; the active layer of the output transistor and the active layer of the output control transistor are different portions of the at least one common semiconductor pattern, respectively.

For example, in the display substrate provided by an embodiment of the present disclosure, the at least one common semiconductor pattern comprises a plurality of common semiconductor patterns, and the plurality of common semiconductor patterns are spaced apart from each other and arranged in parallel in the second direction.

For example, in the display substrate provided by an embodiment of the present disclosure, a gate electrode of the output transistor comprises a plurality of sub-gate electrodes connected in parallel, and the plurality of sub-gate electrodes of the output transistor are parallel to each other in the first direction; and a gate electrode of the output control transistor comprises a plurality of sub-gate electrodes connected in parallel, and the plurality of sub-gate electrodes of the output control transistor are parallel to each other in the first direction.

For example, the display substrate provided by an embodiment of the present disclosure, further comprises a second power line that provides the second voltage, a second power line transfer electrode, and a third transfer electrode; the second power line extends along the first direction, and an orthographic projection of the second power line on the base substrate is on a side of the orthographic projection of the active layer of the first control transistor on the base substrate and the orthographic projection of the active layer of the second control transistor on the base substrate away from the display region; the second power line transfer electrode and the second power line are connected to each other and are formed integrally; a first electrode of the output transistor is connected to the second power line through the second power line transfer electrode, and a second electrode of the output transistor is connected to the third transfer electrode; a first electrode of the output control transistor is connected to the first power line through the first power line transfer electrode, and a second electrode of the output control transistor is connected to the third transfer electrode; and the output terminal comprises the third transfer electrode.

For example, in the display substrate provided by an embodiment of the present disclosure, a ratio between a width of the second power line in the second direction and a width of the first clock signal line in the second direction is greater than or equal to 1.2 and less than or equal to 3; and a ratio between the width of the second power line in the second direction and a width of the second clock signal line in the second direction is greater than or equal to 1.2 and less than or equal to 3.

For example, in the display substrate provided by an embodiment of the present disclosure, an orthographic projection of the second power line on the base substrate is on a side of orthographic projections of the first clock signal line and the second clock signal line on the base substrate close to the display region.

For example, in the display substrate provided by an embodiment of the present disclosure, the output circuit further comprises a first capacitor, and the output control circuit further comprises a second capacitor; an orthographic projection of the first capacitor on the base substrate is between an orthographic projection of the active layer of the output transistor on the base substrate and the orthographic projection of the first power line on the base substrate, and the orthographic projection of the first capacitor on the base substrate and the orthographic projection of the active layer of the output transistor on the base substrate are arranged side by side in the second direction; an orthographic projection of the second capacitor on the base substrate is between an orthographic projection of the active layer of the output control transistor on the base substrate and the orthographic projection of the first power line on the base substrate, and the orthographic projection of the second capacitor on the base substrate and the orthographic projection of the active layer of the output control transistor on the base substrate are arranged side by side in the second direction; and the orthographic projection of the first capacitor on the base substrate and the orthographic projection of the second capacitor on the base substrate are arranged side by side in the first direction.

For example, in the display substrate provided by an embodiment of the present disclosure, a first electrode of the first capacitor and a gate electrode of the output transistor are connected to each other and are formed integrally, and a second electrode of the first capacitor is connected to the third transfer electrode through a hole penetrating an insulating layer; and a first electrode of the second capacitor and a gate electrode of the output control transistor are connected to each other and are formed integrally, and a second electrode of the second capacitor is connected to the first power line through a hole penetrating the insulating layer.

For example, in the display substrate provided by an embodiment of the present disclosure, the second node control circuit further comprises a third capacitor; and an orthographic projection of the third capacitor on the base substrate is between, in the first direction, the orthographic projection of the active layer of the third control transistor on the base substrate and the orthographic projection of the active layer of the second control transistor on the base substrate.

For example, the display substrate provided by an embodiment of the present disclosure, further comprises an electrode connection wire and a fourth transfer electrode; the first transfer electrode further comprises a second sub-portion extending along the second direction, and an end of the second sub-portion of the first transfer electrode is connected to a first electrode of the third capacitor through a hole penetrating an insulating layer; the first electrode of the third capacitor and a gate electrode of the third control transistor are connected to each other and are integrally formed, and a second electrode of the third capacitor and the electrode connection wire are connected to each other and are integrally formed; the electrode connection wire extends along the second direction, a first end of the electrode connection wire is connected to the first clock signal line through a hole penetrating the insulating layer, and a second end of the electrode connection wire is connected to the second electrode of the third capacitor; and the fourth transfer electrode extends along the first direction, a first end of the fourth transfer electrode is connected to the second end of the electrode connection wire through a hole penetrating the insulating layer, and a second end of the fourth transfer electrode is connected to a first electrode of the third control transistor.

For example, in the display substrate provided by an embodiment of the present disclosure, the second node noise reduction circuit comprises a fourth control transistor; an active layer of the fourth control transistor extends along the second direction; and an orthographic projection of the active layer of the fourth control transistor on the base substrate is on a side of the orthographic projection of the active layer of the third control transistor on the base substrate away from the orthographic projection of the active layer of the second control transistor on the base substrate in the first direction.

For example, in the display substrate provided by an embodiment of the present disclosure, a minimum distance in the second direction between the orthographic projection of the active layer of the fourth control transistor on the base substrate and the orthographic projections of the first clock signal line and the second clock signal line on the base substrate is a fourth distance; and a difference between the third distance and the fourth distance is greater than or equal to 0 and less than or equal to the size of the active layer of the third control transistor in the second direction or a size of the active layer of the fourth control transistor in the second direction.

For example, the display substrate provided by an embodiment of the present disclosure, further comprises a fifth transfer electrode and a second connection wire; the fifth transfer electrode extends along the second direction, a first end of the fifth transfer electrode is connected to a second electrode of the third control transistor, and a second end of the fifth transfer electrode is connected to a first electrode of the fourth control transistor; a first end of the second connection wire is connected to the fifth transfer electrode through a hole penetrating an insulating layer, and a second end of the second connection wire is connected to a gate electrode of the output control transistor; the second connection wire is formed integrally with the gate electrode of the output control transistor; and a second electrode of the fourth control transistor is connected to the first power line transfer electrode.

For example, in the display substrate provided by an embodiment of the present disclosure, the input circuit comprises an input transistor, and the third node control circuit comprises a fifth control transistor, an active layer of the input transistor and an active layer of the fifth control transistor respectively extend along the first direction and are arranged side by side in the second direction; and an orthographic projection of the active layer of the input transistor on the base substrate and an orthographic projection of the active layer of the fifth control transistor on the base substrate are on a side of the orthographic projection of the active layer of the fourth control transistor on the base substrate away from the orthographic projection of the active layer of the third control transistor on the base substrate.

For example, in the display substrate provided by an embodiment of the present disclosure, a minimum distance in the second direction between the orthographic projection of the active layer of the input transistor on the base substrate and the orthographic projections of the first clock signal line and the second clock signal line on the base substrate is a fifth distance; and a difference between the fourth distance and the fifth distance is greater than or equal to 0 and less than or equal to 1.5 times the size of the active layer of the fourth control transistor in the second direction.

For example, in the display substrate provided by an embodiment of the present disclosure, a minimum distance in the first direction between the orthographic projection of the active layer of the input transistor on the base substrate and the orthographic projection of the active layer of the fourth control transistor on the base substrate is a sixth distance; a minimum distance in the first direction between the orthographic projection of the active layer of the fifth control transistor on the base substrate and the orthographic projection of the active layer of the fourth control transistor on the base substrate is a seventh distance; and a difference between the sixth distance and the seventh distance is greater than or equal to 0 and less than or equal to a size of the active layer of the input transistor in the first direction or a size of the active layer of the fifth control transistor in the first direction.

For example, the display substrate provided by an embodiment of the present disclosure, further comprises a third connection wire, a fourth connection wire, a sixth transfer electrode, and a seventh transfer electrode; a first electrode of the input transistor is connected to a first end of the sixth transfer electrode, and a second electrode of the input transistor is connected to the second transfer electrode; the third connection wire extends along the second direction, a first end of the third connection wire is connected to the first clock signal line through a hole penetrating an insulating layer, and a second end of the third connection wire is connected to a gate electrode of the input transistor; the third connection wire and the gate electrode of the input transistor are formed integrally; a gate electrode of the fifth control transistor is connected to the second power line transfer electrode through a hole penetrating the insulating layer, a first electrode of the fifth control transistor is connected to a second end of the sixth transfer electrode, and a second electrode of the fifth control transistor is connected to a first end of the seventh transfer electrode; and a second end of the seventh transfer electrode is connected to a first end of the fourth connection wire through a hole penetrating the insulating layer, a second end of the fourth connection wire is connected to a gate electrode of the output transistor, and the fourth connection wire and the gate electrode of the output transistor are formed integrally.

For example, in the display substrate provided by an embodiment of the present disclosure, the sixth transfer electrode extends along the second direction.

For example, the display substrate provided by an embodiment of the present disclosure, further comprises a trigger signal line and a gate drive circuit; the gate drive circuit comprises a plurality of shift register units that are cascaded; the trigger signal line is configured to provide a trigger signal to the gate drive circuit; an orthographic projection of the trigger signal line on the base substrate is on a side of an orthographic projection of the first clock signal line on the base substrate and an orthographic projection of the second clock signal line on the base substrate away from the display region; and the trigger signal line is connected to the input circuit of a first stage of shift register unit of the gate drive circuit to provide the trigger signal as an input signal of the first stage of shift register unit.

At least one embodiment of the present disclosure also provides a display device, which comprises the display substrate according to any one of embodiments of the present disclosure.

For example, in the display device provided by an embodiment of the present disclosure, the display device is an organic light-emitting diode display device.

For example, the display device provided by an embodiment of the present disclosure, further comprises pixel units arranged in an array, an output signal output by an output circuit of the shift register unit of the display substrate is output to the pixel units as a reset control signal.

At least one embodiment of the present disclosure also provides a manufacturing method of the display substrate according to any one of embodiments of the present disclosure, and the manufacturing method comprises: providing the base substrate; and forming the shift register unit, a first power line for providing a first voltage, a second power line for providing a second voltage, the first clock signal line, and the second clock signal line on the base substrate, wherein forming the shift register unit comprises: sequentially forming a semiconductor layer, a first insulating layer, a first conductive layer, a second insulating layer, a second conductive layer, a third insulating layer, and a third conductive layer in a direction perpendicular to the base substrate; active layers of respective transistors are on the semiconductor layer, gate electrodes of the respective transistor and first electrodes of respective capacitors are on the first conductive layer, second electrodes of the respective capacitors are on the second conductive layer, and the first power line, the second power line, the first clock signal line, the second clock signal line, and first electrodes and second electrodes of the respective transistors are on the third conductive layer; and the respective transistors and the respective capacitors are connected to each other and are connected to the first power line, the second power line, the first clock signal line, and the second clock signal through holes penetrating the first insulating layer, the second insulating layer, or the third insulating layer.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

Figure 1A:
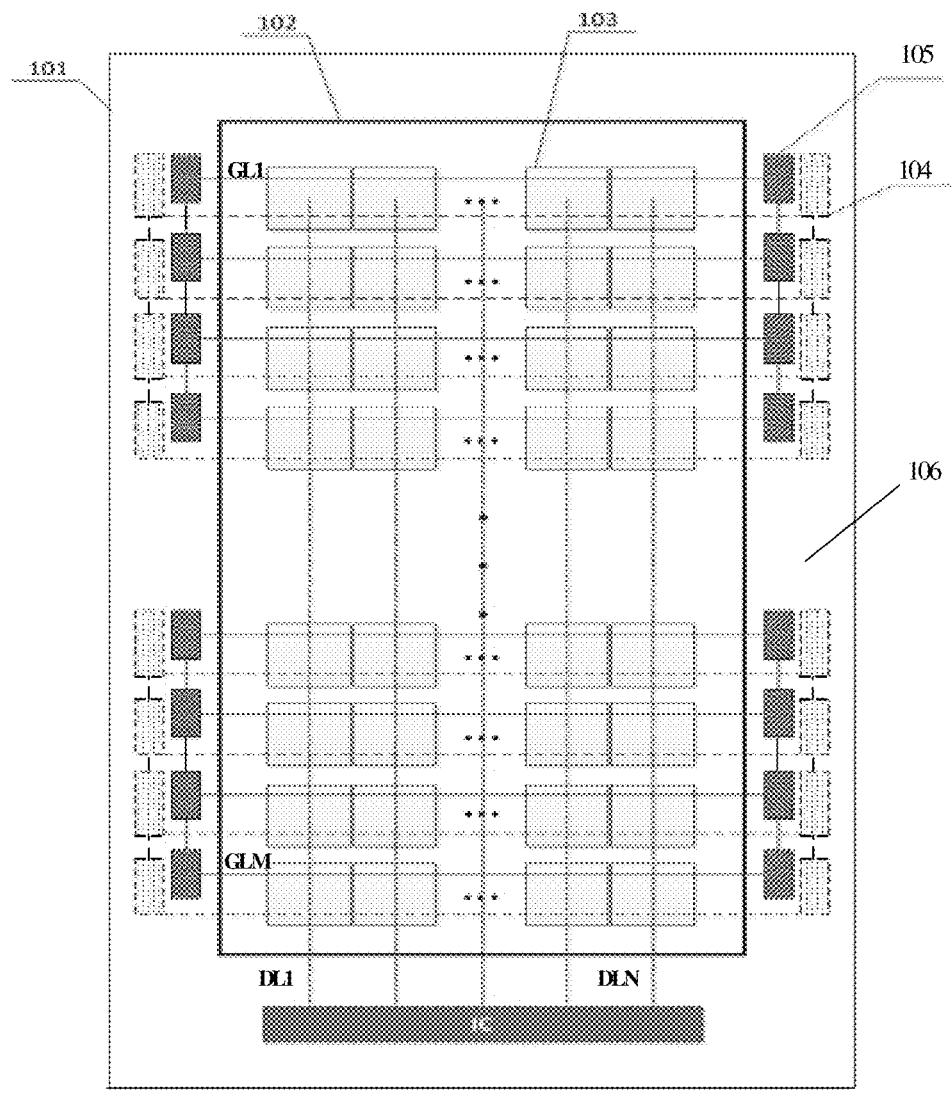
FIG. 1A is a schematic diagram of an overall circuit structure of a display panel.

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure is illustrated by several specific examples below. In order to keep the following description of embodiments of the present invention clear and concise, detailed descriptions of known functions and known components may be omitted. When any component of an embodiment of the present invention appears in more than one drawing, the component is denoted by the same reference numeral in each drawing.

FIG. 1A is a schematic diagram of an overall circuit structure of a display panel. For example, as shown in FIG. 1A, 101 represents the overall outer frame line of a display panel. The display panel includes a display region (that is, a pixel array region) 102 and a peripheral region 106 located around the display region 102; the display region 102 includes a plurality of pixel units 103 arranged in an array; the peripheral region 106 includes a scan drive shift register unit 104, a plurality of scan drive shift register units 104 that are cascaded constitute a gate drive circuit (Gate GOA), which is used to provide, for example, gate scan signals shifted row by row to the pixel units 103 arranged in an array in the display region 102 of the display panel 101; the peripheral region 106 also includes a reset control shift register unit 105, a plurality of reset control shift register units 105 that are cascaded constitute a reset control drive circuit array, which is used to provide, for example, reset control signals shifted row by row to the pixel units 103 arranged in an array in the display region 102 of the display panel 101, that is, is the gate drive circuit used to output the reset control signal; the peripheral region 106 also includes a light-emitting control shift register unit (not shown), and a plurality of light-emitting control shift register units that are cascaded form a light-emitting control drive circuit array, which is used to provide, for example, light-emitting control signals shifted row by row to the pixel units 103 arranged in an array in the display region 102 of the display panel 101, that is, a gate drive circuit for outputting the light-emitting control signal.

In some embodiments, an output signal (i.e., a reset control signal) output by an output circuit of the reset control shift register unit 105 is correspondingly output to a row of pixel units 103.

For example, in some embodiments, the reset control shift register unit 105 may be located on a side of the scan drive shift register unit 104 close to the display region 102 as shown in FIG. 1A; in some embodiments, the reset control shift register unit 105 may also be located on a side of the scan drive shift register unit 104 away from the display region 102, and the embodiments of the present disclosure are not limited to this case.

As shown in FIG. 1A, a plurality of data lines DL1 to DLN (N is an integer greater than 1) connected to a data driving chip IC longitudinally pass through the display region 102 to provide data signals for the pixel units 103 arranged in an array; a plurality of groups of gate lines GL1~GLM (M is an integer greater than 1) connected to the scan drive shift register unit 104, the reset control shift register unit 105, and the light-emitting control shift register unit cross the display region 102 laterally, so as to provide gate scan signals, reset control signals, and light-emitting control signals for the pixel units 103 arranged in an array. For example, each pixel unit 103 may include a pixel circuit with a circuit structure such as 7T1C, 8T2C, or 4T1C in the art, and a light-emitting element, the pixel circuit operates under the control of the data signal transmitted through the data line and the gate scan signal, the reset control signal, and the light-emitting control signal transmitted through the gate line to drive the light-emitting element to emit light so as to achieve operations such as display. The light-emitting element may be, for example, an organic light-emitting diode (OLED) or a quantum dot light-emitting diode (QLED).

Figure 1B:
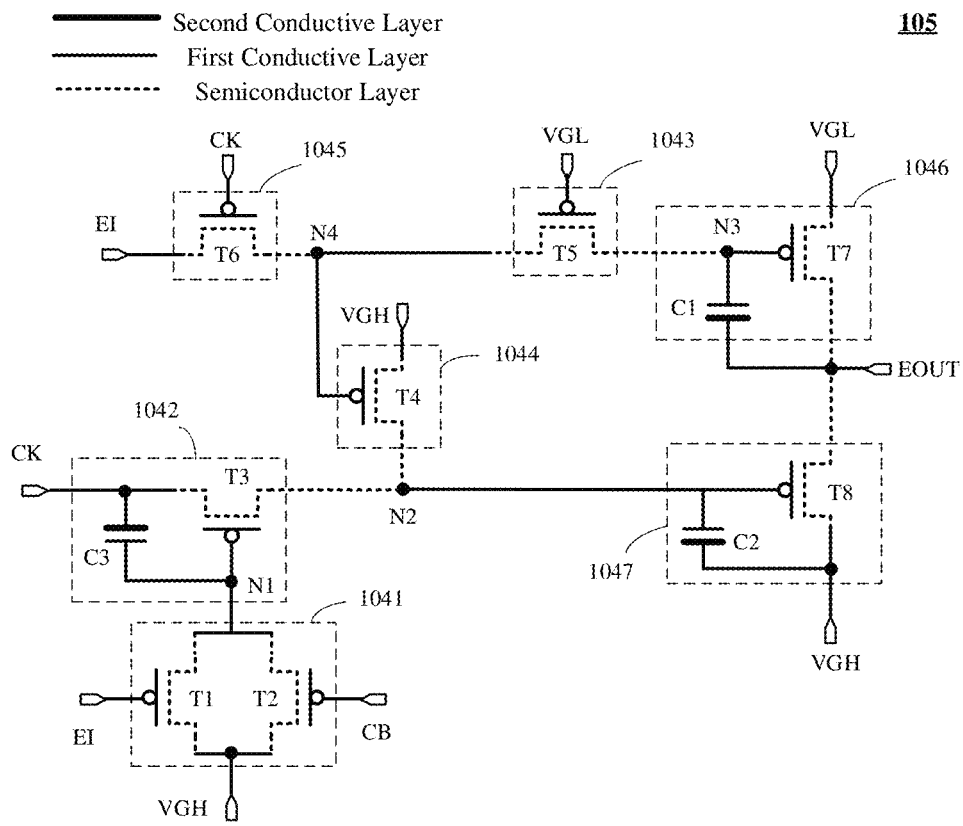
FIG. 1B is a circuit diagram of a reset control shift register unit.
Figure 1C:
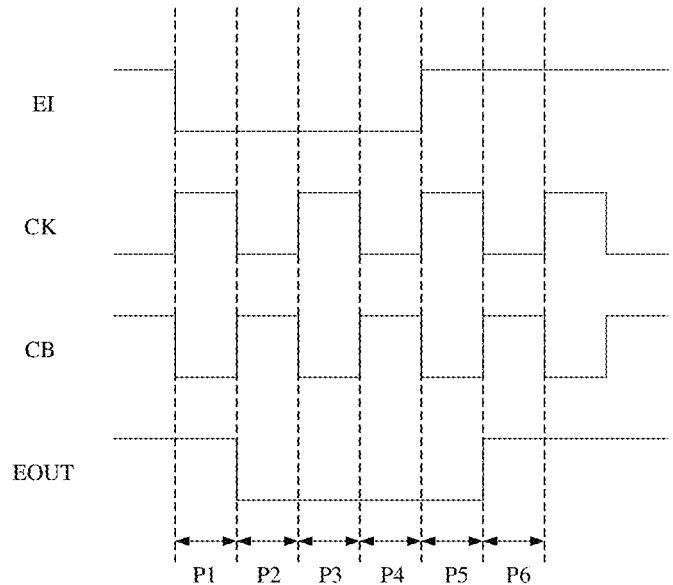
FIG. 1C is a signal timing diagram of the reset control shift register unit shown in FIG. 1B during operation.

FIG. 1B is a circuit diagram of a reset control shift register unit. FIG. 1C is a signal timing diagram of the reset control shift register unit shown in FIG. 1B during operation. The working process of the reset control shift register unit will be briefly introduced below in conjunction with FIG. 1B and FIG. 1C.

As shown in FIG. 1B, the reset control shift register unit 105 includes 8 transistors (a first control transistor T1, a second control transistor T2, a third control transistor T3, a fourth control transistor T4, a fifth control transistor T5, an input transistor T6, an output transistor T7, and an output control transistor T8) and three capacitors (a first capacitor C1, a second capacitor C2, and a third capacitor C3). For example, in the case where a plurality of reset control shift register units 105 are cascaded, a second electrode of an input transistor T6 in a first stage of reset control shift register unit 105 is connected to an input terminal EI, the input terminal EI is configured to be connected to the trigger signal line to receive the trigger signal as an input signal, a second electrode of an input transistor T6 in the other stage of reset control shift register unit 105 is electrically connected to an output terminal EOUT of a previous stage of reset control shift register unit 105, to receive the output signal output by the output terminal EOUT of the previous stage of reset control shift register unit 105 as the input signal, thereby achieving shift output, to provide, for example, the reset control signals shifted row by row to the pixel units 103 arranged in an array in the display region 102 of the display panel 101.

In addition, as shown in FIG. 1B, the reset control shift register unit further includes a first clock signal terminal CK and a second clock signal terminal CB. For example, the first clock signal terminal CK is connected to the first clock signal line or the second clock signal line to receive a first clock signal.

For example, in the case where the first clock signal terminal CK is connected to the first clock signal line, the first clock signal line provides the first clock signal, and in the case where the first clock signal terminal CK is connected to the second clock signal line, the second clock signal line provides the first clock signal; the specific situations depend on the actual situation, and the embodiments of the present disclosure are not limited to this case. Similarly, the second clock signal terminal CB is connected to the second clock signal line or the first clock signal line to receive a second clock signal. In the following, the case where the first clock signal terminal CK is connected to the first clock signal line to receive the first clock signal, and the second clock signal terminal CB is connected to the second clock signal line to receive the second clock signal is taken as an example to describe the present disclosure, and the embodiments of the present disclosure are not limited to this case. For example, the first clock signal and the second clock signal may use pulse signals with a duty cycle greater than 50%, and the difference between the two is, for example, half a cycle; VGH represents the first power line and the first voltage provided by the first power line, VGL represents the second power line and the second voltage provided by the second power line, and the first voltage is greater than the second voltage. For example, the first voltage is a DC high level, and the second voltage is a DC low level. N1, N2, N3, and N4 respectively represent the first node, the second node, the third node, and the fourth node in the circuit schematic diagram.

As shown in FIG. 1B, a gate electrode of the input transistor T6 is connected to the first clock signal terminal CK to receive the first clock signal, a second electrode of the input transistor T6 is connected to the input terminal IN, and a first electrode of the input transistor T6 is connected to the fourth node N4. For example, in the case where the reset control shift register unit is the first stage of reset control shift register unit, the input terminal IN is connected to the trigger signal line to receive the trigger signal, in the case where the reset control shift register unit is a reset control shift register unit in other stages except the first stage of reset control shift register unit, the input terminal IN is connected to the output terminal EOUT of the previous stage of reset control shift register unit.

A gate electrode of the fifth control transistor T5 is connected to the second power line VGL to receive the second voltage, a first electrode of the fifth control transistor T5 is connected to the fourth node N4, and a second electrode of the fifth control transistor T5 is connected to the third node N3.

A gate electrode of the output transistor T7 is connected to the third node N3, a first electrode of the output transistor T7 is connected to the second power line VGL to receive the second voltage, and a second electrode of the output transistor T7 is connected to the output terminal EOUT.

A first electrode of the first capacitor C1 is connected to the third node N3, and a second electrode of the first capacitor C1 is connected to the output terminal EOUT.

A gate of the first control transistor T1 is connected to the input terminal EI, a first electrode of the first control transistor T1 is connected to the first power line VGH to receive the first voltage, and a second electrode of the first control transistor T1 is connected to the first node N1. For example, in the case where the reset control shift register unit is the first stage of reset control shift register unit, the input terminal EI is connected to the trigger signal line to receive the trigger signal; in the case where the reset control shift register unit is one of reset control shift register units in other stages except the first stage, the input terminal EI is connected to the output terminal EOUT of the previous stage of reset control shift register unit.

A gate electrode of the second control transistor T2 is connected to the second clock signal terminal CB to receive the second clock signal, a first electrode of the second control transistor T2 is connected to the first power line VGH to receive the first voltage, and a second electrode of the second control transistor T2 is connected to the first node N1.

A gate electrode of the third control transistor T3 is connected to the first node N1, a first electrode of the third control transistor T3 is connected to the first clock signal terminal CK to receive the first clock signal, and a second electrode of the third control transistor T3 is connected to the second node N2.

A first electrode of the third capacitor C3 is connected to the first node N1, and a second electrode of the third capacitor C3 is connected to the first clock signal terminal CK to receive the first clock signal.

A gate electrode of the fourth control transistor T4 is connected to the fourth node N4, a first electrode of the fourth control transistor T4 is connected to the second node N2, and a second electrode of the fourth control transistor T4 is connected to the first power line VGH to receive the first voltage.

A gate electrode of the output control transistor T8 is connected to the second node N2, a first electrode of the output control transistor T8 is connected to the first power line VGH to receive the first voltage, and a second electrode of the output control transistor T8 is connected to the output terminal EOUT.

A first electrode of the second capacitor C2 is connected to the second node N2, and a second electrode of the second capacitor C2 is connected to the first power line VGH to receive the first voltage.

The transistors in the reset control shift register unit 105 as shown in FIG. 1B are all described by using P-type transistors as an example, that is, each transistor is turned on in the case where a gate electrode of the transistor is connected to a low level (turned-on level), and is turned off in the case where the gate electrode of the transistor is connected to a high level (turned-off level). In this case, the first electrode of the transistor can be a source electrode, and the second electrode of the transistor can be a drain electrode.

The reset control shift register unit includes, but is not limited to, the configuration as shown in FIG. 1B, for example, respective transistors in the reset control shift register unit 105 may also adopt N-type transistors or a combination of P-type transistors and N-type transistors, so long as the respective port polarities of the selected type transistor are connected according to the port polarities of the corresponding transistor in the embodiments of the present disclosure.

It should be noted that the transistors used in the reset control shift register unit can all be thin film transistors or field effect transistors or other switching devices with the same characteristics. Here, thin film transistors are used as examples for description. For example, an active layer (channel region) of the transistor is made of semiconductor materials, such as polysilicon (such as low-temperature polysilicon or high-temperature polysilicon), amorphous silicon, indium gallium tin oxide (IGZO), etc., while a gate electrode, a source electrode, a drain electrode, etc. of the transistor are made of metal materials, such as metal aluminum or aluminum alloy. The source electrode and the drain electrode of the transistor used here can be symmetrical in structure, and therefore, the source electrode and the drain electrode of the transistor can have no difference in structure. In the embodiments of the present disclosure, in order to distinguish the two electrodes of the transistor other than the gate electrode, one electrode of the two electrodes is directly described as a first electrode and the other electrode of the two electrodes is described as a second electrode. In addition, in the embodiments of the present disclosure, the electrodes of the capacitor may be metal electrodes or one of the electrodes of the capacitor may be made of a semiconductor material (for example, doped polysilicon).

FIG. 1C is a signal timing diagram of the reset control shift register unit 105 shown in FIG. 1B during operation. The working process of the reset control shift register unit will be described in detail below in conjunction with FIG. 1B and FIG. 1C. For example, the working principle of the first stage of reset control shift register unit 105 will be described, and the working principles of the reset control shift register units 105 in the other stages are similar to this case, and will not be repeated. As shown in FIG. 1C, the working process of the reset control shift register unit 105 includes 6 phases, namely a first phase t1, a second phase t2, a third phase t3, a fourth phase t4, a fifth phase t5, and a sixth phase t6, and FIG. 1C shows the timing waveforms of the various signals in each phase.

In the input phase t1, as shown in FIG. 1C, the first clock signal line provides a high level, and therefore, the first clock signal terminal CK connected to the first clock signal line receives the high-level first clock signal, and the input transistor T6 is turned off. Due to the storage effect of the first capacitor C1, the level of the third node N3 can be maintained at a high level, so that the output transistor T7 is turned off. The fifth control transistor T5 is turned on in response to the low-level second voltage, so that the level of the fourth node N4 becomes a high level, and the fourth control transistor T4 is turned off. The trigger signal line provides a low level. Therefore, the input terminal EI connected to the trigger signal line receives a low-level trigger signal, and the first control transistor T1 is turned on. The second clock signal line provides a low level. Therefore, the second clock signal terminal CB connected to the second clock signal line receives a low-level second clock signal, and the second control transistor T2 is turned on. The high-level first voltage is transmitted to the first node N1 through the turned-on first control transistor T1 and the turned-on second control transistor T2, so that the level of the first node N1 becomes a high level, and the third control transistor T3 is turned off. Due to the storage effect of the second capacitor C2, the level of the second node N2 can be maintained at a low level, so that the output control transistor T8 is turned on. The high-level first voltage is transmitted to the output terminal EOUT through the turned-on output control transistor T8. Therefore, in the first phase P1, the output signal output by the output terminal EOUT of the reset control shift register unit 105 is at a high level.

In the second phase P2, as shown in FIG. 1C, the input terminal EI receives the low-level trigger signal provided by the trigger signal line, and the first control transistor T1 is turned on. The second clock signal terminal CB receives the high-level second clock signal provided by the second clock signal line, and the second control transistor T2 is turned off. The high-level first voltage is transmitted to the first node N1 through the turned-on first control transistor T1, so that the level of the first node N1 becomes a high level, and the third control transistor T3 is turned off. The first clock signal terminal CK receives the low-level first clock signal provided by the first clock signal line, and the input transistor T6 is turned on. Because the input terminal EI receives the low-level trigger signal provided by the trigger signal line, the level of the fourth node N4 becomes a low level, so that the fourth control transistor T4 is turned on. The high-level first voltage is transmitted to the second node N2 through the turned-on fourth control transistor T4, so that the output control transistor T8 is turned off. The fifth control transistor T5 is turned on in response to the low-level second voltage, so that the level of the third node N3 becomes a low level, therefore, the output transistor T7 is turned on, and the low-level second voltage is transmitted to the output terminal EOUT through the turned-on output transistor T7. Therefore, in the second phase P2, the output signal output by the output terminal EOUT of the reset control shift register unit 105 is at a low level.

In the third phase P3, as shown in FIG. 1C, the input terminal EI receives the low-level trigger signal provided by the trigger signal line, and the first control transistor T1 is turned on. The second clock signal terminal CB receives the low-level second clock signal provided by the second clock signal line, and the second control transistor T2 is turned on. The high-level first voltage is transmitted to the first node N1 through the turned-on first control transistor T1 and the turned-on second control transistor T2, so that the level of the first node N1 becomes a high level, and the third control transistor T3 is turned off. Due to the storage effect of the second capacitor C2, the level of the second node N2 can be maintained at a high level, so that the output control transistor T8 is turned off. The first clock signal terminal CK receives the high-level first clock signal provided by the first clock signal line, and the input transistor T6 is turned off. Due to the storage effect of the first capacitor C1, the level of the third node N3 can be maintained at a low level, so that the output transistor T7 is turned on, the low-level second voltage is transmitted to the output terminal EOUT through the turned-on output transistor T7. At the same time, the level of the third node N3 is further pulled down to be lower than the second voltage, so that the fifth control transistor T5 is turned off. Therefore, in the third phase P3, the output signal output by the output terminal EOUT of the reset control shift register unit 105 is at a low level.

In the fourth phase P4, as shown in FIG. 1C, the input terminal EI receives the low-level trigger signal provided by the trigger signal line, and the first control transistor T1 is turned on. The second clock signal terminal CB receives the high-level second clock signal provided by the second clock signal line, and the second control transistor T2 is turned off. The high-level first voltage is transmitted to the first node N1 through the turned-on first control transistor T1, so that the level of the first node N1 becomes a high level, and the third control transistor T3 is turned off. The first clock signal terminal CK receives the low-level first clock signal provided by the first clock signal line, and the input transistor T6 is turned on. Because the input terminal EI receives the low-level trigger signal provided by the trigger signal line, the level of the fourth node N4 becomes a low level, so that the fourth control transistor T4 is turned on. The high-level first voltage is transmitted to the second node N2 through the turned-on fourth control transistor T4, so that the output control transistor T8 is turned off. Due to the storage effect of the first capacitor C1, the level of the third node N3 can be maintained at a low level, so that the output transistor T7 is turned on, and the low-level second voltage is transmitted to the output terminal EOUT through the turned-on output transistor T7. At the same time, the level of the third node N3 is further pulled down to be lower than the second voltage, so that the fifth control transistor T5 is turned off. Therefore, in the fourth phase P4, the output signal output by the output terminal EOUT of the reset control shift register unit 105 is at a low level.

In the fifth phase P5, as shown in FIG. 1C, the input terminal EI receives the high-level trigger signal provided by the trigger signal line, and the first control transistor T1 is turned off. The second clock signal terminal CB receives the low-level second clock signal provided by the second clock signal line, and the second control transistor T2 is turned on. The high-level first voltage is transmitted to the first node N1 through the turned-on second control transistor T2, so that the level of the first node N1 becomes a high level, and the third control transistor T3 is turned off. Due to the storage effect of the second capacitor C2, the level of the second node N2 can be maintained at a high level, so that the output control transistor T8 is turned off. The first clock signal terminal CK receives the high-level first clock signal provided by the first clock signal line, and the input transistor T6 is turned off. Due to the storage effect of the first capacitor C1, the level of the third node N3 can be maintained at a low level, so that the output transistor T7 is turned on, and the low-level second voltage is transmitted to the output terminal EOUT through the turned-on output transistor T7. At the same time, the level of the third node N3 is further pulled down to be lower than the second voltage, so that the fifth control transistor T5 is turned off. Therefore, in the fifth phase P5, the output signal output by the output terminal EOUT of the reset control shift register unit 105 is at a low level.

In the sixth phase P6, as shown in FIG. 1C, the first clock signal terminal CK receives the low-level first clock signal provided by the first clock signal line, and the input transistor T6 is turned on. Because the input terminal EI receives the high-level trigger signal provided by the trigger signal line, the level of the fourth node N4 becomes a high level, so that the fourth control transistor T4 is turned off. The fifth control transistor T5 is turned on in response to the low-level second voltage, so that the level of the third node N3 becomes a high level, and therefore, the output transistor T7 is turned off. The input terminal EI receives the high-level trigger signal provided by the trigger signal line, and the first control transistor T1 is turned off. The second clock signal terminal CB receives the high-level second clock signal provided by the second clock signal line, and the second control transistor T2 is turned off. Due to the storage effect of the third capacitor C3, under the action of the low-level first clock signal received by the first clock signal terminal CK, the level of the first node N1 becomes a low level, so that the third control transistor T3 is turned on. The low level received by the first clock signal terminal CK is transmitted to the second node N2 through the turned-on third control transistor T3, so that the output control transistor T8 is turned on. The high-level first voltage is transmitted to the output terminal EOUT through the turned-on output control transistor T8. Therefore, in the sixth phase P6, the output signal output by the output terminal EOUT of the reset control shift register unit 105 is at a high level.

As AMOLED (Active-matrix organic light-emitting diode) technology matures, more and more mobile terminals use the AMOLED as a display panel. At present, for market, an AMOLED product with a narrow frame has more competitive advantages and are favored by more consumers. However, the size of the frame is not only affected by the encapsulation technology, but also is largely limited by the overall size of the GOA (for example, the gate drive circuit, the reset control drive circuit array, and the light-emitting control drive circuit array, etc.). The larger the size of the GOA, the larger the sizes of the left frame and the right frame of the panel, conversely, the smaller the size of the GOA, the narrower the frame. However, at present, by taking the reset control drive circuit array as an example, the arrangement of transistors and capacitors in GOA occupies a large space in a direction from the left frame to the right frame of the panel, which causes a waste of layout space of the display substrate and is not conducive to the implementation of the narrow frame of the display substrate.

At least one embodiment of the present disclosure provides a display substrate, the display substrate comprises: a base substrate, comprising a display region and a peripheral region located on at least one side of the display region; and a shift register unit, a first clock signal line, and a second clock signal line, which are located on the peripheral region of the base substrate. The first clock signal line and the second clock signal line extend along a first direction on the base substrate, and the first clock signal line and the second clock signal line are configured to respectively provide a first clock signal or a second clock signal to the shift register unit; the shift register unit comprises a first control transistor, a second control transistor, and a third control transistor, an active layer of the first control transistor, an active layer of the second control transistor, and an active layer of the third control transistor respectively extend along a second direction that is different from the first direction, an orthographic projection of the active layer of the first control transistor on the base substrate, an orthographic projection of the active layer of the second control transistor on the base substrate, and an orthographic projection of the active layer of the third control transistor on the base substrate are on a side of orthographic projections of the first clock signal line and the second clock signal line on the base substrate close to the display region, a minimum distance in the second direction between the orthographic projection of the active layer of the first control transistor on the base substrate and the orthographic projections of the first clock signal line and the second clock signal line on the base substrate is a first distance, a minimum distance in the second direction between the orthographic projection of the active layer of the second control transistor on the base substrate and the orthographic projections of the first clock signal line and the second clock signal line on the base substrate is a second distance, a minimum distance in the second direction between the orthographic projection of the active layer of the third control transistor on the base substrate and the orthographic projections of the first clock signal line and the second clock signal line on the base substrate is a third distance, a difference between the first distance and the second distance is greater than or equal to 0 and is less than or equal to a size of the active layer of the first control transistor in the second direction or a size of the active layer of the second control transistor in the second direction, a difference between the first distance and the third distance is greater than or equal to 0 and is less than or equal to 2 times the size of the active layer of the first control transistor in the second direction or 2 times a size of the active layer of the third control transistor in the second direction, and a difference between the second distance and the third distance is greater than or equal to 0 and is less than or equal to 2 times the size of the active layer of the second control transistor in the second direction or 2 times the size of the active layer of the third control transistor in the second direction.

At least one embodiment of the present disclosure also provides a display device corresponding to the above-mentioned display substrate and a manufacturing method of the display substrate.

The display substrate provided by the above-mentioned embodiments of the present disclosure optimizes the circuit connection and structure layout of the shift register unit, compresses the size of the shift register unit in the second direction to a certain extent, reduces the space that the shift register unit needs to occupy in the peripheral region of the display substrate, which facilitates the implementation of the narrow frame design of the display substrate, and at the same time ensures the display quality of the display substrate.

Hereinafter, embodiments of the present disclosure will be explained in detail with reference to the drawings. It should be noted that the same reference numeral in different drawings will be used to refer to the same element that has been described.

Figure 2A:
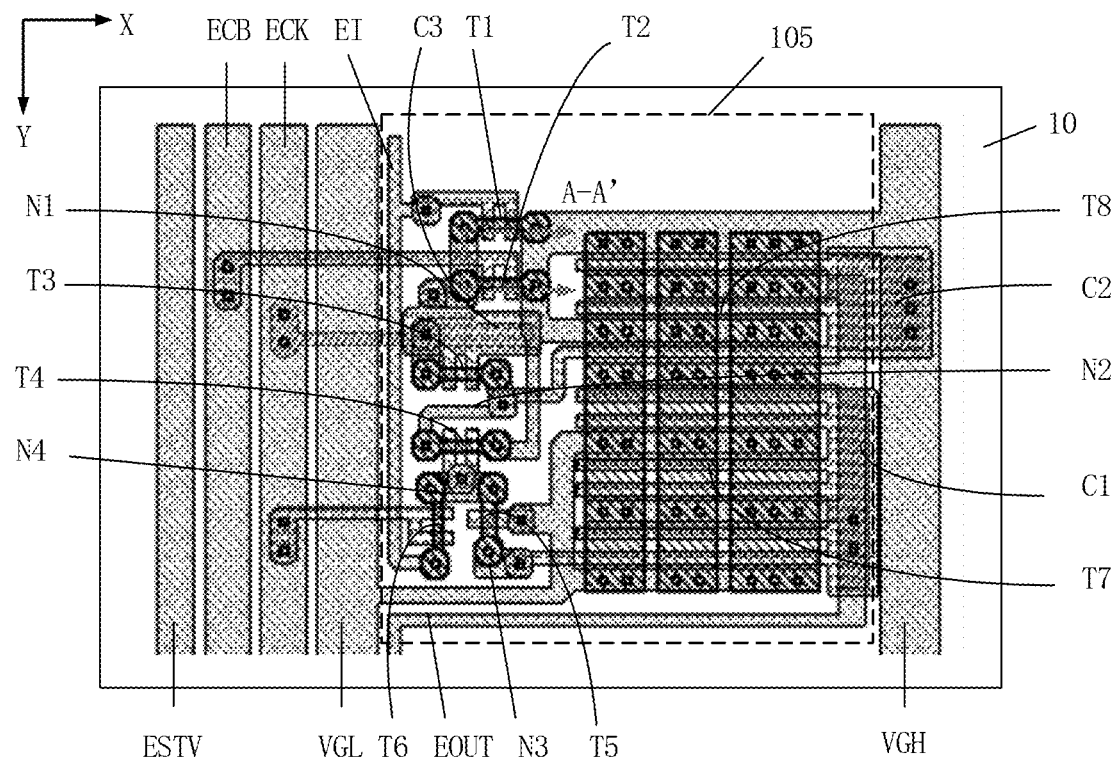
FIGS. 2A and 2B are schematic diagrams of a layout of a display substrate provided by at least one embodiment of the present disclosure.

FIG. 2A is a schematic diagram of a layout of a display substrate provided by at least one embodiment of the present disclosure.

For example, as shown in FIG. 2A, the display substrate includes a base substrate 10, and a shift register unit 105, a first power line VGH, a second power line VGL, and a plurality of clock signal lines, which are disposed on the base substrate 10, for example, the plurality of clock signal lines may include the first clock signal line ECK, the second clock signal line ECB, and the trigger signal line ESTV shown in FIG. 2A. For example, in an embodiment of the present disclosure, the shift register unit 105 may be the reset control shift register unit 105 as shown in FIG. 1B. For the sake of convenience and conciseness, hereinafter, the reset control shift register unit 105 will be referred to as a shift register unit for short to describe the present disclosure.

For example, the first power line VGH, the second power line VGL, and the plurality of clock signal lines (for example, the first clock signal line ECK, the second clock signal line ECB, and the trigger signal line ESTV) extend along the first direction Y on the base substrate 10, and are configured to respectively provide a first voltage, a second voltage, and a plurality of clock signals (for example, a first clock signal, a second clock signal, or a trigger signal, etc.) to the shift register unit 105. For example, the first power line VGH is configured to provide the first voltage to the shift register unit 105, the second power line VGL is configured to provide the second voltage to the shift register unit 105; the first clock signal line ECK and the second clock signal line ECB are configured to provide the first clock signal or the second clock signal to the shift register unit 105, respectively. For example, the second voltage is less than the first voltage, for example, the first voltage is a high DC level, and the second voltage is a low DC level. For the specific connection relationship between the first power line VGH, the second power line VGL, as well as the plurality of clock signal lines, and the shift register unit 105, can refer to the following description.

It should be noted that in the embodiments of the present disclosure, the case that the first clock signal line ECK is used to provide the first clock signal to the shift register unit 105 and the second clock signal line ECB is used to provide the second clock signal to the shift register unit 105 is taken as an example to illustrate, the embodiments of the present disclosure include but are not limited to this case; in some other embodiments of the present disclosure, it may also be that the first clock signal line ECK provides the second clock signal to the shift register unit 105, and the second clock signal line ECB provides the first clock signal to the shift register unit 105, and the embodiments of the present disclosure are not limited to this case.

It should be noted that the first power line VGH, the second power line VGL, and the plurality of clock signal lines may extend along the first direction Y and be arranged parallel to each other, or may also cross a certain angle (for example, less than or equal to 20°), and the embodiments of the present disclosure are not limited to this case.

For example, the base substrate 10 can be made of, for example, glass, plastic, quartz, or other suitable materials, and the embodiments of the present disclosure are not limited to this case.

For example, referring to FIGS. 1A and 2A, the display substrate provided by the embodiments of the present disclosure includes a display region 102 (for example, the display region 102 may also be referred to as a pixel array region) and a peripheral region 106 located on at least one side of the pixel array region. For example, the above-mentioned first power line VGH, the above-mentioned second power line VGL, the above-mentioned plurality of clock signal lines, and the above-mentioned shift register unit 105 are located on the peripheral region 106 of the base substrate 10 and on a side of the base substrate 10 (as shown in FIG. 1A, located between the display region 102 and a side edge of the base substrate 10), for example, as shown in FIG. 1A, can be located on the left side and the right side of the base substrate 10, of course, can also be located on the left side or the right side of the base substrate 10, and the embodiments of the present disclosure are not limited to this case.

For example, an orthographic projection of the second power line VGL on the base substrate 10 and orthographic projections of the plurality of clock signal lines on the base substrate 10 are all located on a side of an orthographic projection of the shift register unit 105 on the base substrate 10 away from the display region 102, for example, in the second direction X, are all located on the left side of the shift register unit 105 shown in FIG. 2A. An orthographic projection of the first power line VGH on the base substrate 10 partially overlaps with the orthographic projection of the shift register unit 105 on the base substrate 10, and is located on a side of the orthographic projection of the shift register unit 105 on the base substrate 10 close to the display region 102, for example, in the second direction X, the first power line VGH is located on the right side of the shift register unit 105 as shown in FIG. 2A, that is, is located between the orthographic projection of the shift register unit 105 on the base substrate 10 and the display region 102. That is, the orthographic projection of the shift register unit 105 on the base substrate 10 is located between the orthographic projection of the first power line VGH on the base substrate 10 and the orthographic projection of the second power line VGL on the base substrate 10.

For example, as shown in FIG. 2A, the orthographic projection of the second power line VGL on the base substrate 10 is located between the orthographic projections of the first clock signal line ECK as well as the second clock signal line ECB on the base substrate 10 and the orthographic projection of the shift register unit 105 on the base substrate 10. For example, the first clock signal line ECK and the second clock signal line ECB are sequentially arranged from right to left along the second direction X on the base substrate 10, that is, the orthographic projection of the second clock signal line ECB on the base substrate 10 is located on a side of the orthographic projection of the first clock signal line ECK on the base substrate 10 away from the orthographic projection of the second power line VGL on the base substrate 10.

It should be noted that the above-mentioned plurality of clock signal lines may also include a trigger signal line ESTV that provides a trigger signal. For example, an orthographic projection of the trigger signal line ESTV on the base substrate 10 may be located on a side of the orthographic projections of the first clock signal line ECK and the second clock signal line ECB on the base substrate 10 away from the orthographic projection of the shift register unit 105 on the base substrate 10, that is, the first clock signal line ECK, the second clock signal line ECB, and the trigger signal line ESTV are sequentially arranged from right to left along the second direction X on the base substrate 10.

It should be noted that the above wiring positions are only exemplary, as long as it can be satisfied that the settings of the lines facilitate the connection between the lines and the shift register unit, and the embodiments of the present disclosure are not limited to this case.

For example, the included angle between the first direction Y and the second direction X is between 70° and 90°, and includes 70° and 90°. For example, the included angle between the first direction Y and the second direction X can be 70°, 75°, 80°, 85°, or 90°, etc.. The specific value of the included angle can be set according to actual conditions, and is not limited in the embodiments of the present disclosure.

For example, the display region 102 includes a plurality of pixel units 103 arranged in an array. For example, each of the plurality of pixel units 103 includes a pixel circuit, for example, may further include a light-emitting element (not shown in the figure).

For example, a plurality of shift register units 105 (that is, the reset control shift register units 105) that are cascaded constitute a reset control drive circuit array. For example, the output terminals EOUT of the plurality of shift register units 105 are respectively connected to the reset control signal terminals of respective rows of pixel circuits located in the pixel array region to provide output signals (for example, the reset control signals) to the respective rows of pixel circuits, thereby achieving driving the light-emitting element to emit light. For example, the pixel circuit may be a pixel circuit including circuit structures, such as 7T1C, 2T1C, 4T2C, 8T2C, etc. in the art, which will not be repeated here.

It should be noted that FIG. 2A shows only a K-th (K is an odd number greater than 1) stage of shift register unit 105 in the gate drive circuit. For example, a first clock signal terminal CK of a first stage of shift register unit (not shown in the figure) is connected to the first clock signal line ECK to receive the first clock signal, a second clock signal terminal CB of the first stage of shift register unit is connected to the second clock signal line ECB to receive the second clock signal, a first clock signal terminal CK of a second stage of shift register unit (not shown in the figure) is connected to the second clock signal line ECB to receive the first clock signal, a second clock signal terminal CB of the second stage of shift register unit is connected to the first clock signal line ECK to receive the second clock signal, and so on. For example, as shown in FIG. 2A, a first clock signal terminal CK of the K-th (K is an odd number greater than 1) stage of shift register unit 105 is connected to the first clock signal line ECK to receive the first clock signal, a second clock signal terminal CB of the K-th stage of shift register unit 105 is connected to the second clock signal line ECB to receive the second clock signal, a first clock signal terminal CK of a (K+1)-th stage of shift register unit is connected to the second clock signal line ECB to receive the first clock signal, and a second clock signal terminal CB of the (K+1)-th stage of shift register unit is connected to the first clock signal line ECK to receive the second clock signal. It should be noted that, the connection mode between each stage of the shift register units and the clock signal lines may also adopt other connection modes in the art, and is not limited in the embodiments of the present disclosure. For example, an input terminal EI of the first stage of shift register unit is connected to the trigger signal line ESTV to receive the trigger signal as an input signal, an input terminal of the second stage of shift register unit is connected to an output terminal EOUT of a previous stage of shift register unit (for example, the first stage of shift register unit). The connection mode of the shift register units in other stages is similar to this case. The following takes the structure of the K-th stage of shift register unit 105 as an example for description, and the embodiments of the present disclosure are not limited in this aspect.

For example, as shown in FIG. 1B, in some examples, the shift register unit 105 includes a first node control circuit 1041, a second node control circuit 1042, a third node control circuit 1043, a second node noise reduction circuit 1044, an input circuit 1045, an output circuit 1046, and an output control circuit 1047.

The first node control circuit 1041 is configured to input the first voltage to the first node N1 under control of the input signal and the second clock signal, thereby controlling the level of the first node N1. For example, the first node control circuit 1041 is connected to the first power line VGH, the input terminal EI, the second clock signal terminal CB (the second clock signal terminal CB of the K-th stage of shift register unit 105 is connected to the second clock signal line ECB to receive the second clock signal, and the second clock signal terminal CB of the (K+1)-th stage of shift register unit is connected to the first clock signal line ECK to receive the second clock signal), and the first node N1, and is configured to be turned on under the control of the input signal received by the input terminal EI and the second clock signal received by the second clock signal terminal CB, so that the first power line VGH is connected to the first node N1 to input the first voltage provided by the first power line VGH to the first node N1, thereby controlling the level of the first node N1. For example, the first node control circuit 1041 may be implemented as the first control transistor T1 and the second control transistor T2 described above, for the connection mode of the first control transistor T1 and the second control transistor T2, reference may be made to the corresponding descriptions above, which will not be repeated here.

The second node control circuit 1042 is configured to input the first clock signal to the second node N2 in response to the level of the first node N1, thereby controlling the level of the second node N2. For example, the second node control circuit 1042 is connected to the first clock signal terminal CK (the first clock signal terminal CK of the K-th stage of shift register unit 105 is connected to the first clock signal line ECK to receive the first clock signal, and the first clock signal terminal CK of the (K+1)-th stage of shift register unit is connected to the second clock signal line ECB to receive the first clock signal), the first node N1, and the second node N2, and is configured to be turned on under the control of the level of the first node N1, and to input the first clock signal to the second node N2 to control the level of the second node N2. For example, the second node control circuit 1042 can be implemented as the third control transistor T3 and the third capacitor C3 described above. For the connection mode of the third control transistor T3 and the third capacitor C3, reference may be made to the corresponding description above, which will not be repeated here. It should be noted that the second node control circuit 1042 is not limited to be connected to the first node N1, and can also be connected to other independent voltage terminals (providing the same voltage as the first node N1) or a separately provided circuit that is the same as the first node control circuit 1041, and the embodiments of the present disclosure are not limited to this case. The connections of other circuits of the shift register unit are similar to this case, and will not be repeated here.

The output control circuit 1047 is configured to output the first voltage to the output terminal EOUT in response to the level of the second node N2. For example, the output control circuit 1047 is connected to the second node N2, the first power line VGH, and the output terminal EOUT, and is configured to be turned on under the control of the level of the second node N2 so as to connect the first power line VGH with the output terminal EOUT to output the first voltage as the output signal at the output terminal EOUT. For example, the output control circuit 1047 can be implemented as the output control transistor T8 and the second capacitor C2 described above, and for the connection mode of the output control transistor T8 and the second capacitor C2, reference may be made to the corresponding description above, and similar portions will not be repeated here. It should be noted that the output control circuit 1047 is not limited to be connected to the second node N2, and can also be connected to other independent voltage terminals (providing the voltage that is the same as the voltage of the second node N2) or a separately provided circuit that is the same as the second node control circuit 1042, and the embodiments of the present disclosure are not limited to this case.

The input circuit 1045 is configured to input an input signal to the fourth node N4 in response to the first clock signal. For example, the input circuit 1045 is connected to the input terminal EI, the fourth node N4, and the first clock signal terminal CK, and is configured to be turned on under the control of the first clock signal received by the first clock signal terminal CK, so as to connect the input terminal EI to the fourth node N4, thereby inputting the input signal received by the input terminal EI to the fourth node N4. For example, the input circuit 1045 may be implemented as the input transistor T6 described above, and for the connection mode of the input transistor T6, reference may be made to the corresponding description above, and similar portions will not be repeated here.

The second node reduction circuit 1044 is configured to input the first voltage to the second node N2 in response to a level of the fourth node N4 to perform noise reduction on the second node N2. For example, the second node noise reduction circuit 1044 is connected to the first power line VGH, the second node N2, and the fourth node N4, and is configured to be turned on under the control of the level of the fourth node N4, so as to connect the second node N2 to the first power line VGH, thereby maintaining the voltage of the second node N2 at a high level to perform noise reduction on the second node N2. For example, the second node noise reduction circuit 1044 can be implemented as the fourth control transistor T4 described above, for the connection mode of the fourth control transistor T4, reference may be made to the corresponding description above, and similar portions will not be repeated here. It should be noted that the second node noise reduction circuit 1044 is not limited to be connected to the fourth node N4, and can also be connected to other independent voltage terminals (providing the voltage that is the same as the voltage of the fourth node N4) or a separately provided circuit that is the same as the input circuit 1045, and the embodiments of the present disclosure are not limited to this case.

The third node control circuit 1043 is configured to control the level of the third node N3 under the control of the second voltage. For example, the third node control circuit 1043 is connected to the second power line VGL, the third node N3, and the fourth node N4, and is configured to be turned on under the control of the second voltage provided by the second power line VGL to input the level of the fourth node N4 to the third node N3. For example, the third node control circuit 1043 can be implemented as the fifth control transistor T5 described above, for the connection mode of the fifth control transistor T5, reference may be made to the corresponding description above, and similar portions will not be repeated here. It should be noted that the third node control circuit 1043 is not limited to be connected to the fourth node N4, and can also be connected to other independent voltage terminals (providing the voltage that is the same as the voltage of the fourth node N4) or a separately provided circuit that is the same as the input circuit 1045, and the embodiments of the present disclosure are not limited to this case.

The output circuit 1046 is configured to output the second voltage to the output terminal EOUT in response to the level of the third node N3. For example, the output circuit 1046 is connected to the third node N3, the output terminal EOUT, and the second power line VGL, and is configured to be turned on under the control of the level of the third node N3, so that the second power line VGL is connected to the output terminal EOUT, thereby outputting the second voltage as the output signal at the output terminal EOUT. For example, the output circuit 1046 can be implemented as the output transistor T7 and the first capacitor C1 described above, for the connection mode of the output transistor T7 and the first capacitor C1, reference may be made to the corresponding description above, and similar portions will not be repeated here. It should be noted that the output circuit 1046 is not limited to be connected to the third node N3, and can also be connected to other independent voltage terminals (providing the voltage that is the same as the voltage of the third node N3) or a separately provided circuit that is the same as the third node control circuit 1043, and the embodiments of the present disclosure are not limited to this case.

It should be noted that the embodiments of the present disclosure only schematically show two clock signal lines (the first clock signal line ECK and the second clock signal line ECB), the display substrate provided by the embodiments of the present disclosure may further include 4, 6, or 8 or more clock signal lines, and the embodiments of the present disclosure are not limited to this case. Correspondingly, in the case where the number of clock signal lines changes, the connection relationship between the shift register unit 105 and the clock signal lines in the display substrate also changes accordingly. The specific content can refer to conventional designs in the field, and will not be repeated here.

Figure 2B:
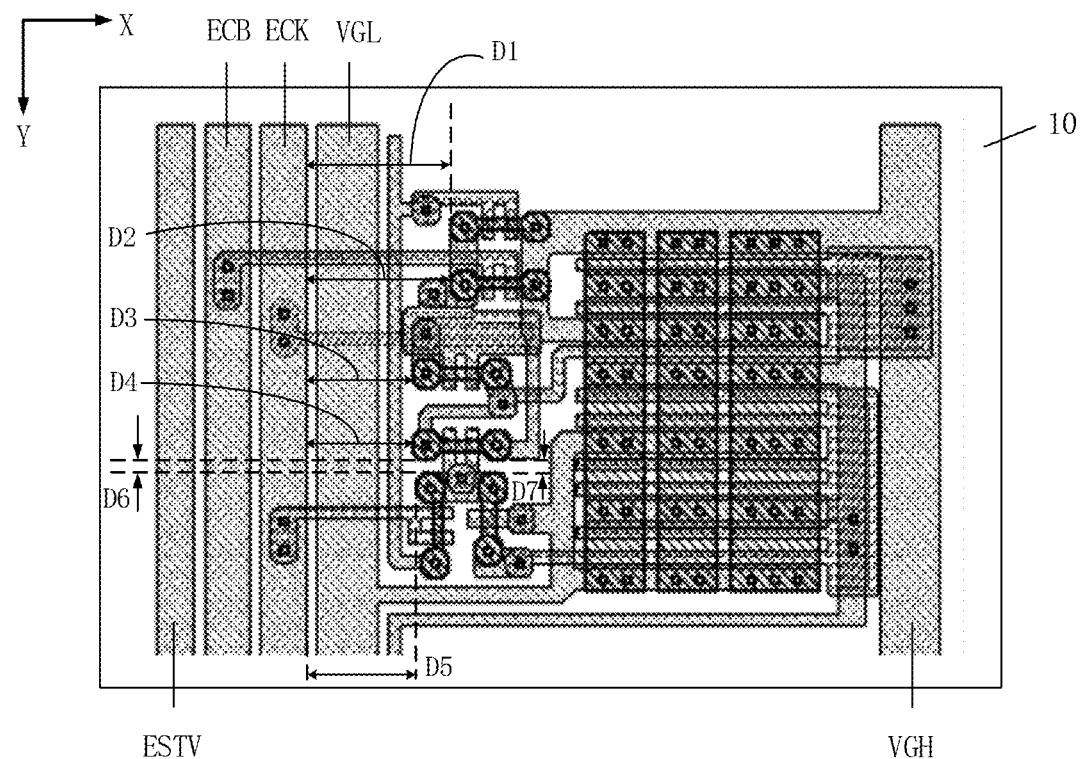
Figure 3A:
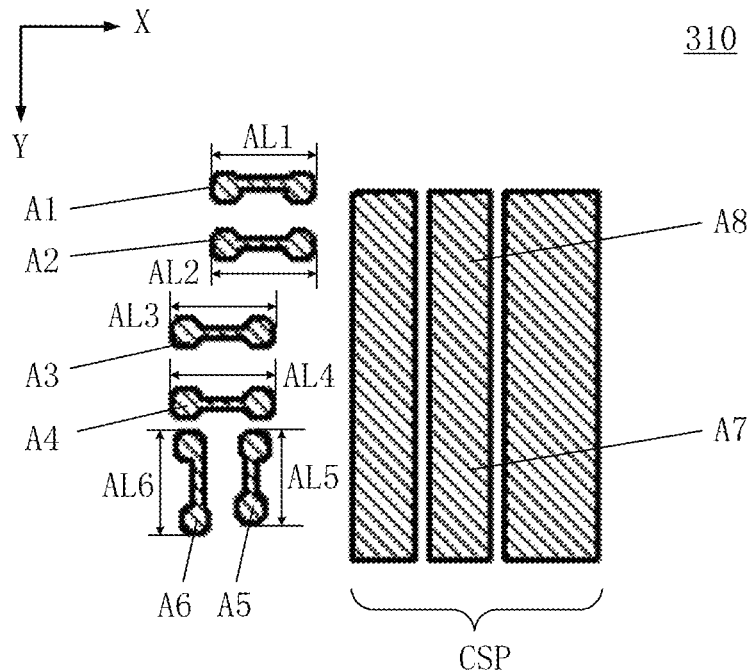
FIGS. 3A and 3B are plane diagrams of a semiconductor layer of a display substrate provided by at least one embodiment of the present disclosure.
Figure 3B:
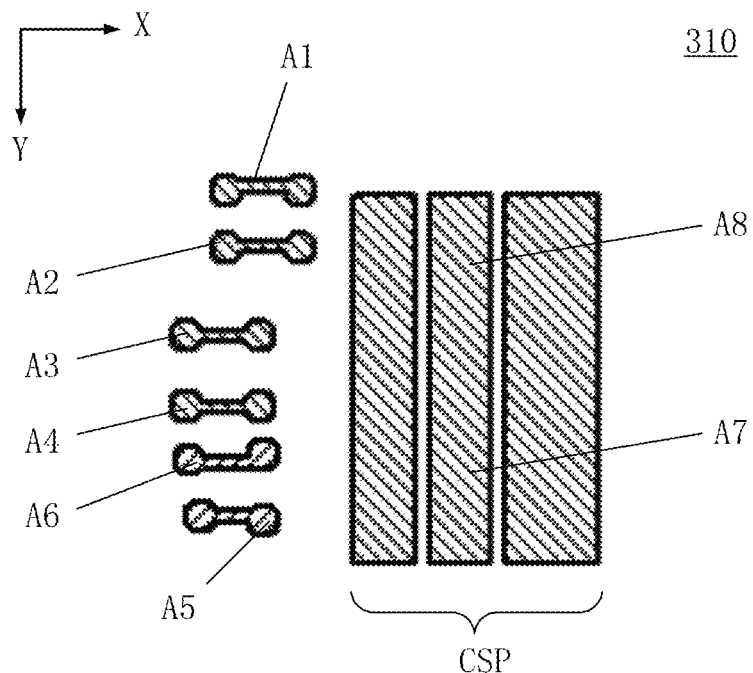
Figure 4:
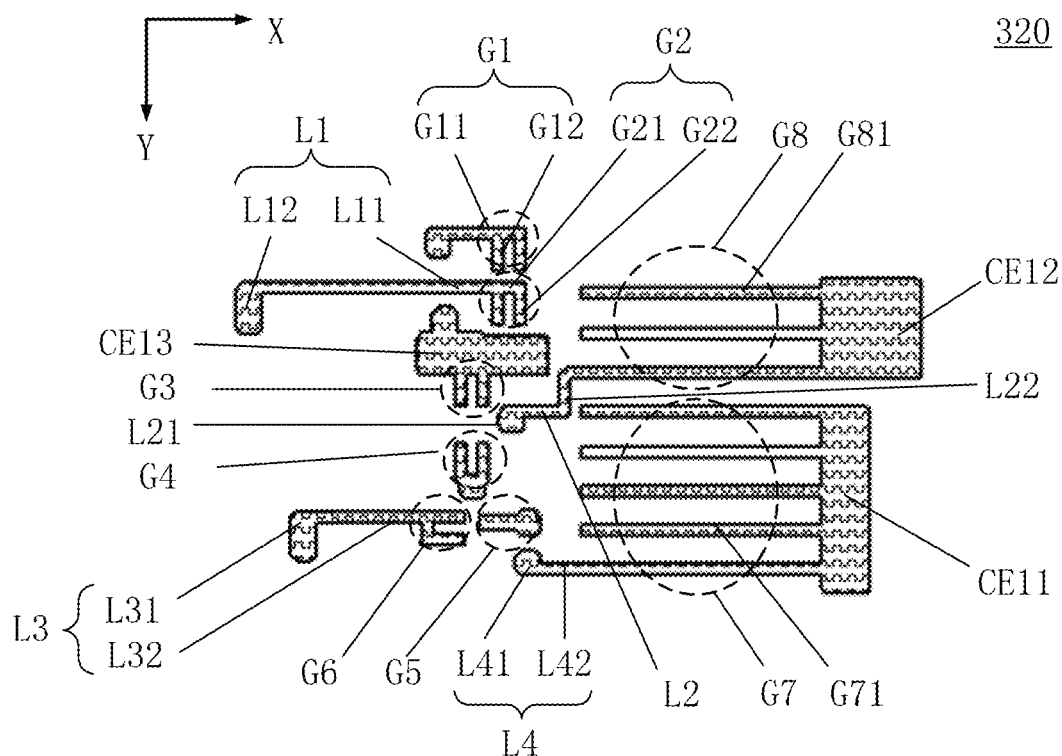
FIG. 4 is a plane diagram of a first conductive layer of a display substrate provided by at least one embodiment of the present disclosure.
Figure 5:
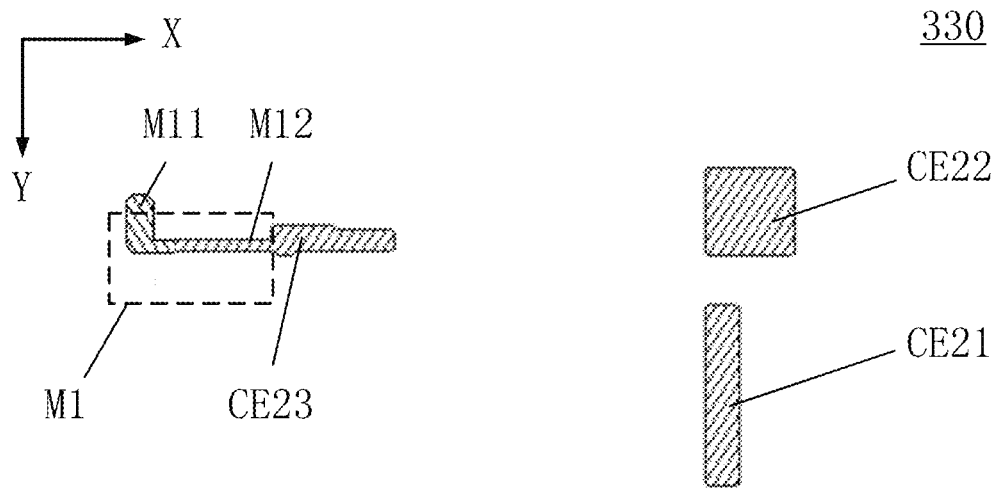
FIG. 5 is a plane diagram of a second conductive layer of a display substrate provided by at least one embodiment of the present disclosure.
Figure 6:
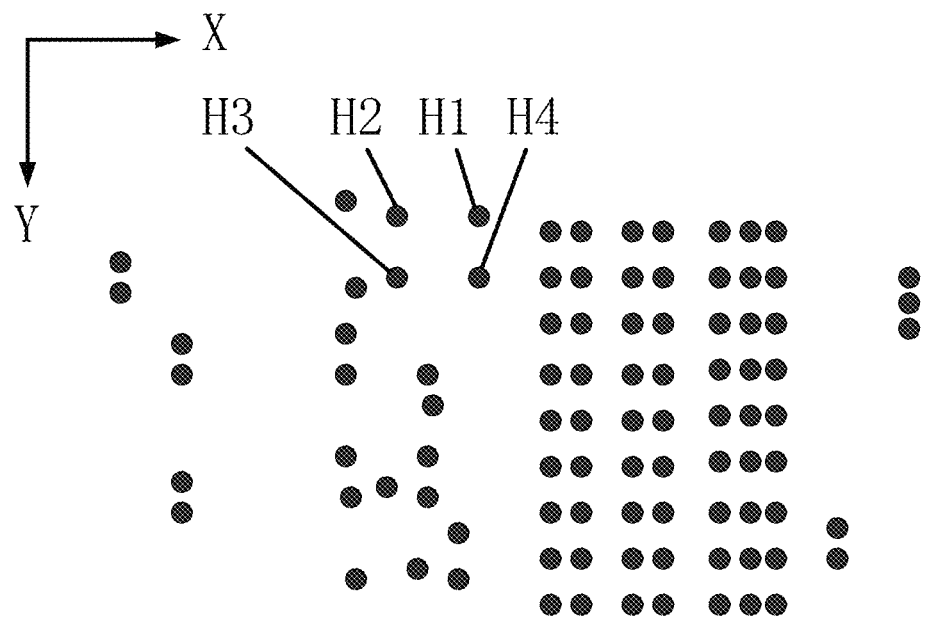
FIG. 6 is a distribution diagram of holes of a display substrate provided by at least one embodiment of the present disclosure.
Figure 7:
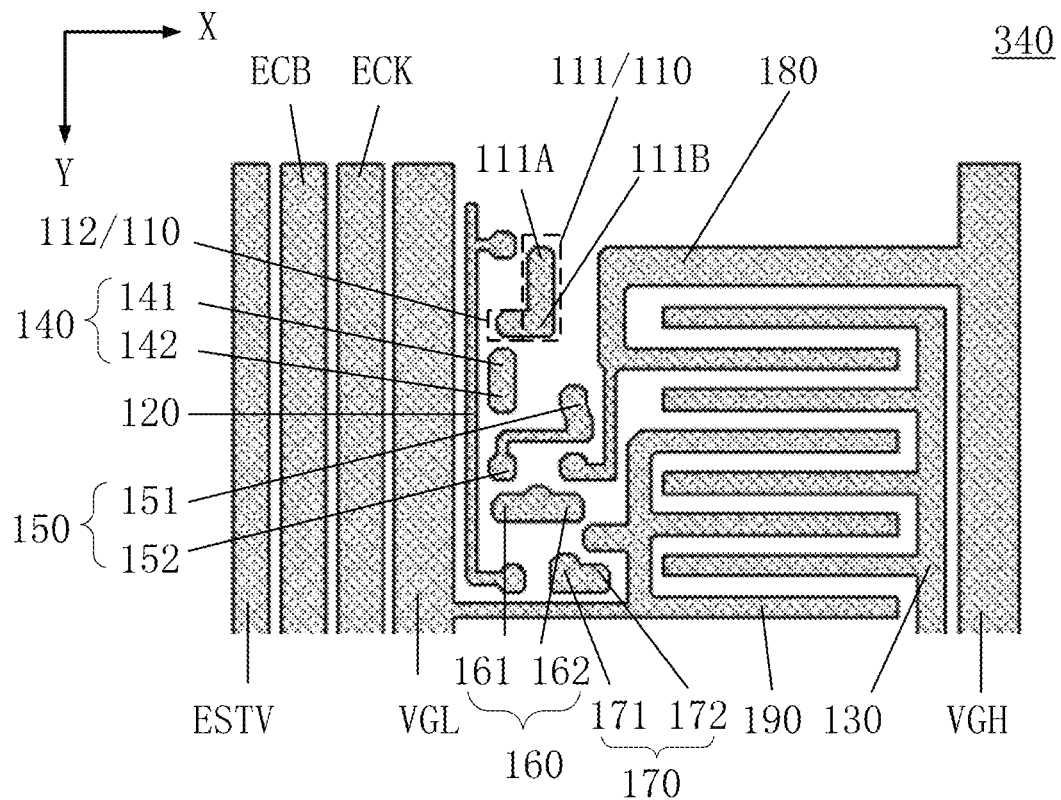
FIG. 7 is a plane diagram of a third conductive layer of a display substrate provided by at least one embodiment of the present disclosure.
Figure 8:
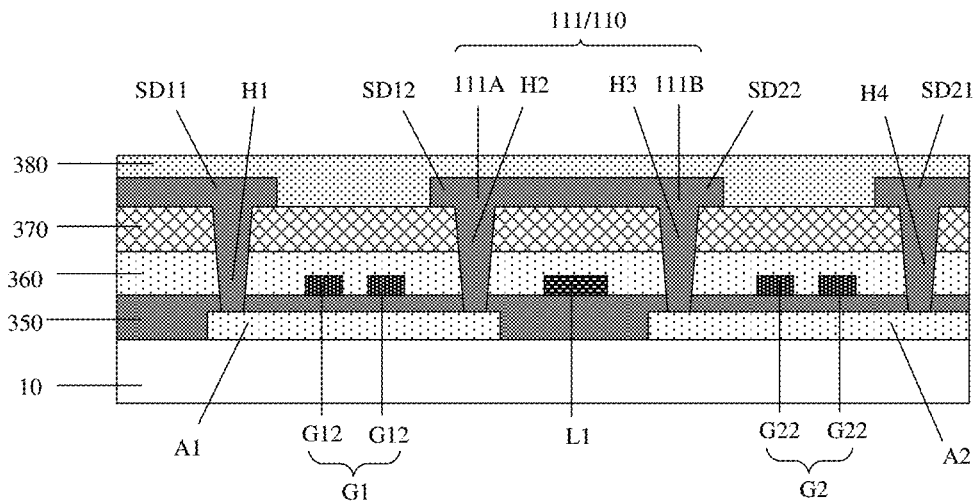
FIG. 8 is a cross-sectional view of some examples of the display substrate shown in FIG. 2A along an A-A' direction.

FIG. 3A, FIG. 4, FIG. 5, and FIG. 7 respectively show plane diagrams of lines of respective layers of the display substrate shown in FIG. 2A. FIG. 3A is a plane diagram of a semiconductor layer of a display substrate provided by at least one embodiment of the present disclosure, FIG. 4 is a plane diagram of a first conductive layer of a display substrate provided by at least one embodiment of the present disclosure, FIG. 5 is a plane diagram of a second conductive layer of a display substrate provided by at least one embodiment of the present disclosure, FIG. 6 is a distribution diagram of holes of a display substrate provided by at least one embodiment of the present disclosure, and FIG. 7 is a plane diagram of a third conductive layer of a display substrate provided by at least one embodiment of the present disclosure. FIG. 8 is a cross-sectional view of some examples of the display substrate shown in FIG. 2A along an A-A' direction. For example, the A-A' direction can be understood as: a direction along a first electrode SD11 of the first control transistor T1→a second electrode SD12 of the first control transistor T1→a second electrode SD22 of the second control transistor T2→a first electrode SD21 of the second control transistor T2, or a direction along the first electrode SD21 of the second control transistor T2→the second electrode SD22 of the second control transistor T2→the second electrode SD12 of the first control transistor T1→the first electrode SD11 of the first control transistor T1. For example, the cross-sectional view as shown in FIG. 8 may correspond to the structure of the first control transistor T1 and the second control transistor T2. The laminated structure of the display substrate provided by at least one embodiment of the present disclosure will be described in detail below with reference to FIGS. 2A-8.

For example, an interlayer insulating layer (for example, including a first insulating layer, a second insulating layer, a third insulating layer, etc.) of the display substrate may be located between the layer structures as shown in FIGS. 3A to 7. For example, the first insulating layer 350 (as shown in FIG. 8) is located between the semiconductor layer 310 as shown in FIG. 3A and the first conductive layer 320 as shown in FIG. 4, the second insulating layer 360 (as shown in FIG. 8) is located between the first conductive layer 320 as shown in FIG. 4 and the second conductive layer 330 as shown in FIG. 5, and the third insulating layer 370 (as shown in FIG. 8) is located between the second conductive layer 330 as shown in FIG. and the third conductive layer 340 as shown in FIG. 7. The holes as shown in FIG. 6 are holes that penetrate one or more layers selected from a group consisting of the first insulating layer 350, the second insulating layer 360, and the third insulating layer 370.

For example, as shown in FIG. 8, the display substrate further includes a fourth insulating layer 380, and the fourth insulating layer 380 is located on the third conductive layer 340, that is, on the side of the third conductive layer 340 away from the base substrate 10, so as to protect the third conductive layer 340.

For example, the materials of the first insulating layer 350, the second insulating layer 360, the third insulating layer 370, and the fourth insulating layer 380 may include inorganic insulating materials, such as SiNx, SiOx, SiNxOy, and organic insulating materials, such as organic resins, or other suitable materials, and are not limited in the embodiments of the present disclosure.

It should be noted that the display substrate as shown in FIG. 2A is described by taking the case that the layout design of the K-th stage of shift register unit in the reset control drive circuit array and the first power line, the second power line, and the clock signal lines connected to the K-th stage of shift register unit as an example, the layout implementation modes of the remaining shift register units in various stages can refer to the layout mode as shown in FIG. 2A, and will not be repeated here. Of course, other suitable layout modes may also be adopted, and the embodiments of the present disclosure are not limited to this case. Of course, the shift register units in various stages in the other reset control drive circuit array can also refer to the layout mode as shown in FIG. 2A, and or other suitable layout implementations can also be adopted, and the embodiments of the present disclosure are not limited to this case.

The display substrate provided by at least one embodiment of the present disclosure will be described in detail below with reference to FIGS. 2A-8.

For example, the active layers A1~A8 of the first control transistor T1, the second control transistor T2, the third control transistor T3, the fourth control transistor T4, the fifth control transistor T5, the input transistor T6, the output transistor T7, and the output control transistor T8 of the shift register unit 105 as shown in FIG. 2A may be formed on the semiconductor layer 310 as shown in FIG. 3A. The semiconductor layer 310 may be formed by patterning a semiconductor material. For example, as shown in FIG. 3A, according to actual different requirements, the semiconductor layer 310 can comprise a short rod-shape portion or a portion having a curved or bent shape, so as to form the active layers A1~A8 of the above-mentioned transistors T1 to T8. The active layer of each transistor may include a source region, a drain region, and a channel region between the source region and the drain region. For example, the channel region has semiconductor characteristics; the source region and the drain region are on both sides of the channel region, respectively, and can be doped with impurities and therefore have conductivity. For example, the source region is a portion of the active layer, and a metal electrode (for example, located in the third conductive layer 340) in contact with the source region corresponds to the source electrode (or called the first electrode) of the transistor; the drain region is a portion of the active layer, and a metal electrode (for example, located in the third conductive layer 340) in contact with the drain region corresponds to the drain electrode (or called the second electrode) of the transistor. For example, the source region is connected to a metal electrode (source electrode) corresponding thereto through a hole penetrating the first insulation layer 350, the second insulation layer 360, and the third insulation layer 370, and the drain region is connected to a metal electrode (drain electrode) corresponding thereto through a hole penetrating the first insulation layer 350, the second insulation layer 360, and the third insulation layer 370.

For example, by taking the first control transistor T1 and the second control transistor T2 as an example, as shown in FIG. 8, the first electrode SD11 of the first control transistor T1 is connected to the source region of the active layer A1 of the first control transistor T1 through a hole H1 penetrating the third insulating layer 370, the second insulating layer 360, and the first insulating layer 350, and the second electrode SD12 of the first control transistor T1 is connected to the drain region of the active layer A1 of the first control transistor T1 through a hole H2 penetrating the third insulating layer 370, the second insulating layer 360, and the first insulating layer 350; the second electrode SD22 of the second control transistor T2 is connected to the drain region of the active layer A2 of the second control transistor T2 through a hole H3 penetrating the third insulating layer 370, the second insulating layer 360, and the first insulating layer 350, and the first electrode SD21 of the second control transistor T2 is connected to the source region of the active layer A2 of the second control transistor T2 through a hole H4 penetrating the third insulating layer 370, the second insulating layer 360, and the first insulating layer 350.

For example, the material of the semiconductor layer 310 may include oxide semiconductors, organic semiconductors, or amorphous silicon, polysilicon, etc., for example, the oxide semiconductors include metal oxide semiconductors (such as indium gallium zinc oxide (IGZO)), and the polysilicon includes low-temperature polysilicon, high-temperature polysilicon, or the like, and the embodiments of the present disclosure are not limited to this case. It should be noted that the above-mentioned source region and drain region may be regions doped with n-type impurities or p-type impurities, and the embodiments of the present disclosure are not limited to this case.

It should be noted that in other examples, the first electrode and the second electrode of each transistor can also be located in other conductive layers, and are connected to their corresponding active layers through holes in an insulating layer between the conductive layer and the semiconductor layer. The embodiments of the present disclosure are not limited to this case.

FIG. 4 shows the first conductive layer 320 of the display substrate. The first conductive layer 320 is disposed on the first insulating layer 350 so as to be insulated from the semiconductor layer 310. For example, the first conductive layer 320 may include the first electrodes CE11, CE12, and CE13 of the first capacitor C1 to the third capacitor C3, and the gate electrodes G1~G8 of the transistors T1~T8 and various wires directly connected to the gate electrodes G1~G8 (for example, a first connection wire L1, a second connection wire L2, the third connection wire L3, and the fourth connection wire L4), and correspondingly, the first insulating layer 350 can also serve as a gate insulating layer. As shown in FIG. 4, the gate electrodes G1~G8 of the transistors T1~T8 are the portions enclosed by circular or elliptical dashed circles, that is, the portions where the semiconductor layer structures of respective transistors overlap with the electrodes or wires on the first conductive layer 320.

FIG. 5 shows the second conductive layer 330 of the display substrate, the second conductive layer 330 includes the second electrodes CE21, CE22, CE23 of the first capacitor C1 to the third capacitor C3, and wires (for example, an electrode connection wire M1) for connecting with signal lines or transfer electrodes on the third conductive layer 340. For example, the second electrode CE21 and the first electrode CE11 at least partially overlap to form the first capacitor C1, the second electrode CE22 and the first electrode CE12 at least partially overlap to form the second capacitor C2, and the second electrode CE23 and the first electrode CE13 at least partially overlap to form the third capacitor C3.

FIG. 7 shows the third conductive layer 340 of the display substrate. The third conductive layer 340 includes a plurality of signal lines (for example, the first clock signal line ECK, the second clock signal line ECB, and the trigger signal line ESTV), the first power line VGH, and the second power line VGL, and the like. It should be noted that the third conductive layer 340 also includes a first transfer electrode 110, a second transfer electrode 120, a third transfer electrode 130, a fourth transfer electrode 140, a fifth transfer electrode 150, a sixth transfer electrode 160, a seventh transfer electrode 170, a first power line transfer electrode 180, a second power line transfer electrode 190, and so on, which are connected among the transistors, the capacitors, and the signal lines. For example, the second transfer electrode 120 includes an input terminal EI, and the third transfer electrode 130 includes an output terminal EOUT.

It should be noted that, in the embodiments of the present disclosure, the second transfer electrode 120 located on the third conductive layer 340 may be used to receive an input signal; while in some other embodiments of the present disclosure, the input signal of the input terminal EI of the shift register unit 105 may also be received by electrodes located in other layers, that is, the input terminal EI may also be disposed in another layer different from the third conductive layer 340, for example, may be disposed in the first conductive layer 320 or the second conductive layer 330, which is not limited in the embodiment of the present disclosure.

It should be noted that, in the embodiments of the present disclosure, the third transfer electrode 130 located on the third conductive layer 340 may be used to provide an output signal; while in some other embodiments of the present disclosure, the output signal of the output terminal EOUT may also be provided by electrodes located in other layers, that is, the output terminal EOUT may also be disposed in another layer different from the third conductive layer 340, for example, may be disposed in the first conductive layer 320 or the second conductive layer 330, which is not limited in the embodiment of the present disclosure.

It should be noted that, in the embodiments of the present disclosure, the second transfer electrode 120 and the third transfer electrode 130 are both located in the third conductive layer 340, therefore, in addition to the last stage of shift register unit 105, the third transfer electrode 130 for providing an output signal can be connected to and be formed integrally with the second transfer electrode 120 in the next stage of shift register unit 105, thereby providing the input signal to the input terminal EI of the next stage of shift register unit 105; in addition to the first stage of shift register unit 105, the second transfer electrode 120 for receiving the input signal can be connected to and be formed integrally with the third transfer electrode 130 in the previous stage of shift register unit 105, so as to receive the output signal of the output terminal EOUT of the previous stage of shift register unit 105 as the input signal of the input terminal EI of the current stage of shift register unit 105.

As shown in FIGS. 2A to 7, the plurality of signal lines, the first power line VGH, and the second power line VGL are connected to the transistors and capacitors in the remaining layers that need to be connected to the plurality of signal lines, the first power line VGH, and the second power line VGL through at least one hole as shown in FIG. 6, and the respective transistors and the respective capacitors are also connected through at least one hole or are bridged through transfer electrodes, which will not be repeated here.

For example, the material of the third conductive layer 340 may include titanium, titanium alloy, aluminum, aluminum alloy, copper, copper alloy, or any other suitable composite materials, and the embodiments of the present disclosure are not limited to this case. For example, the material of the first conductive layer 320 and the material of the second conductive layer 330 may be the same as the material of the third conductive layer 340, and similar portions will not be repeated here.

FIG. 2A is a schematic diagram of the stacking position relationship of the semiconductor layer 310 as shown in FIG. 3A, the first conductive layer 320 as shown in FIG. 4, the second conductive layer 330 as shown in FIG. 5, and the third conductive layer 340 as shown in FIG. 7. The display substrate provided by at least one embodiment of the present disclosure will be described in detail below with reference to FIGS. 2A-8.

For example, as shown in FIGS. 2A and 3A, the active layer A1 of the first control transistor T1 and the active layer A2 of the second control transistor T2 extend along a second direction X different from the first direction Y, respectively. An orthographic projection of the active layer A1 of the first control transistor T1 on the base substrate 10 and an orthographic projection of the active layer A2 of the second control transistor T2 on the base substrate 10 are located on a side of orthographic projections of the first clock signal line ECK and the second clock signal line ECB on the base substrate 10 close to the display region 102, that is, in the second direction X, the active layer A1 of the first control transistor T1 and the active layer A2 of the second control transistor T2 are located on the right side of the first clock signal line ECK and the second clock signal line ECB.

For example, in conjunction with FIG. 2A, FIG. 2B, and FIG. 3A, a minimum distance in the second direction X between the orthographic projection of the active layer A1 of the first control transistor T1 on the base substrate 10 and the orthographic projections of the first clock signal line ECK and the second clock signal line ECB on the base substrate 10 is a first distance D1, and a minimum distance in the second direction X between the orthographic projection of the active layer A2 of the second control transistor T2 on the base substrate 10 and the orthographic projections of the first clock signal line ECK and the second clock signal line ECB on the base substrate 10 is a second distance. For example, the first distance D1 is a spacing distance in the second direction X between the orthographic projection of the active layer A1 of the first control transistor T1 on the base substrate 10 and an edge of the side of the first clock signal line ECK close to the display region 102, and the second distance D2 is a spacing distance in the second direction X between the orthographic projection of the active layer A2 of the second control transistor T2 on the base substrate 10 and an edge of the side of the first clock signal line ECK close to the display region 102. A difference between the first distance D1 and the second distance D2 is greater than or equal to 0 and less than or equal to a size AL1 of the active layer A1 of the first control transistor T1 in the second direction X or a size AL2 of the active layer A2 of the second control transistor T2 in the second direction X, that is, $0 \le |D1-D2| \le AL1$ or $0 \le |D1-D2| \le AL2$. For example, AL1 is a length of the active layer A1 of the first control transistor T1 in the second direction X, and AL2 is a length of the active layer A2 of the second control transistor T2 in the second direction X. Thus, the active layer A1 of the first control transistor T1 and the active layer A2 of the second control transistor T2 are arranged side by side in the first direction Y.

Thus, by enabling the difference between the first distance D1 and the second distance D2 to be greater than or equal to 0 and less than or equal to the size AL1 of the active layer A1 of the first control transistor T1 in the second direction X or the size AL2 of the active layer A2 of the second control transistor T2 in the second direction X, the active layer A1 of the first control transistor T1 and the active layer A2 of the second control transistor T2 can be arranged side by side in the first direction Y, thereby reducing the size of the first control transistor T1 and the size of the second control transistor T2 in the second direction X, and optimizing the layout design of the first control transistor T1 and the second control transistor T2 in the shift register unit 105. Furthermore, the size of the shift register unit 105 in the second direction X is reduced to a certain extent, and the space required by the shift register unit 105 in the peripheral region 106 of the display substrate is reduced, which is beneficial to achieve the narrow frame design of the display substrate and at the same time ensures the display quality of the display substrate. In addition, more sufficient space can be reserved for other transistors, capacitors, wires, etc. in the shift register unit 105, so that the wiring connection and the structural layout of the shift register unit 105 can be further optimized.

For example, a range of the first distance D1 may be 30 μm to 60 μm, for example, 40 μm to 55 μm; a range of the second distance D2 may be 30 μm to 60 μm, for example, 40 μm to 55 μm. As a result, the layout settings of the first control transistor T1 and the second control transistor T2 in the first direction Y and the second direction X are further optimized.

For example, the first distance D1 may be 40 μm, 42 μm, 44 μm, 45 μm, 47 μm, 49 μm, 50 μm, 52 μm, 55 μm, etc., and the second distance D2 may be 40 μm, 42 μm, 44 μm, μm, 47 μm, 49 μm, 50 μm, 52 μm, 55 μm, or the like.

For example, the size AL1 of the active layer A1 of the first control transistor T1 in the second direction X may be set to be similar to the size AL2 of the active layer A2 of the second control transistor T2 in the second direction X, thereby further optimizing the layout structure of the first control transistor T1 and the second control transistor T2 in the display substrate.

For example, as shown in FIGS. 2A and 4, the gate electrode G1 of the first control transistor T1 and the gate electrode G2 of the second control transistor T2 are parallel to each other in the first direction Y, that is, the gate electrode G1 of the first control transistor T1 and the gate electrode G2 of the second control transistor T2 are arranged side by side in the first direction Y, thereby further reducing the size of the first control transistor T1 and the size of the second control transistor T2 in the second direction X, and optimizing the layout design of the first control transistor T1 and the second control transistor T2 in the shift register unit 105.

For example, as shown in FIGS. 2A, 4, and 8, the gate electrode G1 of the first control transistor T1 includes a main body portion G11 extending along the second direction X and two sub-gate electrodes G12, which are parallel to each other, extending from the main body portion G11 of the gate electrode G1 of the first control transistor T1, that is, the first control transistor T1 has a double-gate structure. For example, the two sub-gate electrodes G12, which are parallel to each other, extend along the first direction Y, respectively. The gate electrode G2 of the second control transistor T2 includes a main body portion G21 extending along the second direction X and two sub-gate electrodes G22, which are parallel to each other, extending from the main body portion G21 of the gate electrode G2 of the second control transistor T2, that is, the second control transistor T2 has a double-gate structure. For example, the two sub-gate electrodes G22, which are parallel to each other, extend along the first direction Y, respectively.

Thus, by forming each of the gate electrode G1 of the first control transistor T1 and the gate electrode G2 of the second control transistor T2 to have a "U"-shaped structure, the stability of the first control transistor T1 and the stability of the second control transistor T2 can be improved, thereby improving the performance of the first control transistor T1 and the performance of the second control transistor T2.

It should be noted that in some other embodiments of the present disclosure, by taking the first control transistor T1 as an example, it may also be that the active layer of the first control transistor T1 has a "U"-shaped structure, the gate electrode of the first control transistor T1 has a structure in a shape like a Chinese character " — " and overlapping the "U"-shaped active layer, thereby forming a double-gate structure, as long as the gate electrode of the first control transistor T1 does not affect the arrangement of other structures and does not excessively increase the width of the shift register unit, and the embodiments of the present disclosure are not limited to this case. It should be noted that, it may also be that a single gate electrode overlaps the active layer of the first control transistor T1, which is not limited in the embodiments of the present disclosure.

For example, as shown in FIG. 2A, FIG. 4, and FIG. 7, the display substrate further includes a first connection wire L1. The first connection wire L1 extends along the second direction X, an orthographic projection of the first connection wire L1 on the base substrate 10 is located on a side of an orthographic projection of the gate electrode G2 of the second control transistor T2 on the base substrate 10 away from the display region 102, for example, in the second direction X, the first connection wire L1 is located on the left side of the gate electrode G2 of the second control transistor T2. A first end L11 of the first connection wire L1 is connected to the gate electrode G2 of the second control transistor T2, for example, is connected to the main body portion G21 of the gate electrode G2 of the second control transistor T2, thereby simplifying the layout structure of the first connection wire L1. A second end L12 of the first connection wire L1 is connected to the second clock signal line ECB through a hole penetrating the second insulating layer 360 and the third insulating layer 370 to receive the second clock signal provided by the second clock signal line ECB. Thus, the second clock signal provided by the second clock signal line ECB can be transmitted to the gate electrode G2 of the second control transistor T2 through the first connection wire L1. The first connection wire L1 and the gate electrode G2 of the second control transistor T2 can be integrally formed, thereby simplifying the manufacturing process of the display substrate and reducing the manufacturing cost.

For example, as shown in FIG. 2A, FIG. 7, and FIG. 8, the display substrate further includes a first transfer electrode 110. The first transfer electrode 110 includes a first sub-portion 111 extending along the first direction Y, a first end 111A of the first sub-portion 111 of the first transfer electrode 110 is connected to the second electrode SD12 of the first control transistor T1, and is, for example, preferably formed integrally with the second electrode SD12 of the first control transistor T1; a second end 111B of the first sub-portion 111 of the first transfer electrode 110 is connected to the second electrode SD22 of the second control transistor T2, and is, for example, preferably formed integrally with the second electrode SD22 of the second control transistor T2. Therefore, the connection between the second electrode SD12 of the first control transistor T1 and the second electrode SD22 of the second control transistor T2 is achieved through the first transfer electrode 110.

For example, the first transfer electrode 110 may serve as the first node N1 in the circuit structure as shown in FIG. 1B.

For example, as shown in FIGS. 2A, 3A, 7, and 8, the first power line VGH extends along the first direction Y, an orthographic projection of the first power line VGH on the base substrate 10 is located on a side of the orthographic projection of the active layer A1 of the first control transistor T1 on the base substrate 10 and the orthographic projection of the active layer A2 of the second control transistor T2 on the base substrate 10 close to the display region 102, That is, in the second direction X, the first power line VGH is located on the right side of the active layer A1 of the first control transistor T1 and the active layer A2 of the second control transistor T2. The display substrate further includes a first power line transfer electrode 180, and the first power line transfer electrode 180 is connected to and integrally formed with the first power line VGH to transmit the first voltage provided by the first power line VGH. The first electrode SD11 of the first control transistor T1 and the first electrode SD21 of the second control transistor T2 are respectively connected to the first power line transfer electrode 180, for example, are preferably formed integrally with the first power line transfer electrode 180, so that the first electrode SD11 of the first control transistor T1 and the first electrode SD21 of the second control transistor T2 are respectively connected to the first power line VGH through the first power line transfer electrode 180 to receive the first voltage.

For example, a ratio between a width of the first power line VGH in the second direction X and a width of the first clock signal line ECK in the second direction X is greater than or equal to 1.2 and less than or equal to 3, That is, the width of the first power line VGH in the second direction X may be 1.2 to 3 times the width of the first clock signal line ECK in the second direction X; a ratio between the width of the first power line VGH in the second direction X and a width of the second clock signal line ECB in the second direction X is greater than or equal to 1.2 and less than or equal to 3, that is, the width of the first power line VGH in the second direction X may be 1.2 to 3 times the width of the second clock signal line ECB in the second direction X. As a result, the stability of the signal transmitted on the first power line VGH is improved, and the charging time is reduced.

For example, the width of the first power line VGH in the second direction X may be 1.1 times, 1.2 times, 1.33 times, 1.5 times, 1.8 times, 2 times, 2.2 times, 2.5 times, 2.7 times, or 3 times the width of the first clock signal line ECK in the second direction X, or the like; the width of the first power line VGH in the second direction X may be 1.1 times, 1.2 times, 1.33 times, 1.5 times, 1.8 times, 2 times, 2.2 times, 2.5 times, 2.7 times, or 3 times the width of the second clock signal line ECB in the second direction X, or the like.

For example, as shown in FIG. 2A, FIG. 3A, and FIG. 7, the display substrate further includes a second transfer electrode 120. An orthographic projection of the second transfer electrode 120 on the base substrate 10 is located on a side of the orthographic projection of the active layer A1 of the first control transistor T1 on the base substrate 10 and the orthographic projection of the active layer A2 of the second control transistor T2 on the base substrate 10 away from the display region 102, that is, in the second direction X, the second transfer electrode 120 is located on the left side of the active layer A1 of the first control transistor T1 and the active layer A2 of the second control transistor T2. The second transfer electrode 120 extends along the first direction Y and is connected to the gate electrode G1 of the first control transistor T1 through a hole penetrating the second insulating layer 360 and the third insulating layer 370, for example, is connected to the main body portion G11 of the gate electrode G1 of the first control transistor T1.

For example, in the K-th stage of shift register unit 105, the second transfer electrode 120 is connected to the output terminal EOUT of the previous stage of shift register unit to receive an input signal.

For example, in the case where the shift register unit 105 is a first stage of shift register unit, the second transfer electrode 120 is connected to the trigger signal line ESTV, so that the trigger signal provided by the trigger signal line ESTV is used as the input signal of the current stage of shift register unit.

For example, as shown in FIGS. 2A and 3A, an orthographic projection of an active layer A7 of the output transistor T7 on the base substrate 10 and an orthographic projection of an active layer A8 of the output control transistor T8 on the base substrate 10 are located on a side of the orthographic projection of the active layer A1 of the first control transistor T1 on the base substrate 10 and the orthographic projection of the active layer A2 of the second control transistor T2 on the base substrate 10 close to the display region 102, and is located on a side of the orthographic projection of the first power line VGH on the base substrate 10 away from the display region 102. That is, in the second direction X, the active layer A7 of the output transistor T7 and the active layer A8 of the output control transistor T8 are located between the first power line VGH and the active layer A1 of the first control transistor T1 as well as the active layer A2 of the second control transistor T2.

For example, as shown in FIGS. 2A and 3A, the display substrate includes at least one common semiconductor pattern, for example, the at least one common semiconductor pattern includes a plurality of common semiconductor patterns CSP. The active layer A7 of the output transistor T7 and the active layer A8 of the output control transistor T8 are different portions of the plurality of common semiconductor patterns CSP, respectively, thereby improving the stability of the output transistor T7 and the stability of the output control transistor T8.

For example, the plurality of common semiconductor patterns CSP are spaced apart from each other and arranged in parallel in the second direction X. Or, in some other embodiments of the present disclosure, the plurality of common semiconductor patterns CSP may also be continuously arranged in the second direction X to form a common semiconductor pattern, and the embodiments of the present disclosure are not limited to this case.

For example, in the first direction Y, the active layer A7 of the output transistor T7 is located below the active layer A8 of the output control transistor T8, so that the active layer A7 of the output transistor T7 and the active layer A8 of the output control transistor T8 are arranged side by side in the first direction Y, thereby reducing the size of the active layer A7 of the output transistor T7 and the size of the active layer A8 of the output control transistor T8 in the second directions X.

For example, as shown in FIGS. 2A and 4, the gate electrode G7 of the output transistor T7 includes a plurality of sub-gate electrodes G71 connected in parallel, and the plurality of sub-gate electrodes G71 of the output transistor T7 are parallel to each other in the first direction Y. For example, each sub-gate electrode G71 of the output transistor T7 extends in the second direction X, so that the gate electrode G7 of the output transistor T7 is comb-shaped in the first direction Y, thereby improving the stability of the output transistor T7. The gate electrode G8 of the output control transistor T8 includes a plurality of sub-gate electrodes G81 connected in parallel, and the plurality of sub-gate electrodes G81 of the output control transistor T8 are parallel to each other in the first direction Y. For example, each sub-gate electrode G81 of the output control transistor T8 extends in the second direction X, so that the gate electrode G8 of the output control transistor T8 is comb-shaped in the first direction Y, thereby improving the stability of the output control transistor T8.

For example, as shown in FIGS. 2A, 3A, and 7, the display substrate further includes a third transfer electrode 130 and a second power line transfer electrode 190. The second power line VGL extends along the first direction Y, an orthographic projection of the second power line VGL on the base substrate 10 is located on a side of the orthographic projection of the active layer A1 of the first control transistor T1 on the base substrate 10 and the orthographic projection of the active layer A2 of the second control transistor T2 on the base substrate 10 away from the display region 102, that is, in the second direction X, the second power line VGL is located on the left side of the active layer A1 of the first control transistor T1 and the active layer A2 of the second control transistor T2. The second power line transfer electrode 190 is connected to and is integrally formed with the second power line VGL, thereby transmitting the second voltage provided by the second power line VGL. The first electrode of the output transistor T7 is connected to the second power line VGL through the second power line transfer electrode 190 to receive the second voltage. The first electrode of the output control transistor T8 is connected to the first power line transfer electrode 180, and is, for example, preferably formed integrally with the first power line transfer electrode 180, so that the first electrode of the output control transistor T8 is connected to the first power line VGH through the first power line transfer electrode 180 to receive the first voltage. The second electrode of the output transistor T7 is connected to the third transfer electrode 130, for example, is preferably formed integrally with the third transfer electrode 130, the second electrode of the output control transistor T8 is connected to the third transfer electrode 130, for example, is preferably formed integrally with the third transfer electrode 130, the output terminal EOUT includes the third transfer electrode 130, that is, the second electrode of the output transistor T7 and the second electrode of the output control transistor T8 are respectively connected to the output terminal EOUT through the third transfer electrode 130 to provide the output signal.

For example, the ratio between the width of the second power line VGL in the second direction X and the width of the first clock signal line ECK in the second direction X is greater than or equal to 1.2 and less than or equal to 3, that is, the width of the second power line VGL in the second direction X may be 1.2 to 3 times the width of the first clock signal line ECK in the second direction X; the ratio between the width of the second power line VGL in the second direction X and the width of the second clock signal line ECB in the second direction X is greater than or equal to 1.2 and less than or equal to 3, that is, the width of the second power line VGL in the second direction X may be 1.2 to 3 times the width of the second clock signal line ECB in the second direction X. As a result, the stability of the signal transmitted on the second power line VGL is improved, and the charging time is reduced.

For example, the width of the second power line VGL in the second direction X may be 1.1 times, 1.2 times, 1.33 times, 1.5 times, 1.8 times, 2 times, 2.2 times, 2.5 times, 2.7 times, or 3 times the width of the first clock signal line ECK in the second direction X, and the like, and the width of the second power line VGL in the second direction X may be 1.1 times, 1.2 times, 1.33 times, 1.5 times, 1.8 times, 2 times, 2.2 times, 2.5 times, 2.7 times, or 3 times the width of the second clock signal line ECB in the second direction X, and the like.

For example, as shown in FIGS. 2A, 3A, and 7, the orthographic projection of the first capacitor C1 on the base substrate 10 is located between the orthographic projection of the active layer A7 of the output transistor T7 on the base substrate 10 and the orthographic projection of the first power line VGH on the base substrate 10, and is arranged side by side in the second direction X with the orthographic projection of the active layer A7 of the output transistor T7 on the base substrate 10, that is, in the second direction X, the first capacitor C1 is located between the active layer A7 of the output transistor T7 and the first power line VGH. The orthographic projection of the second capacitor C2 on the base substrate 10 is located between the orthographic projection of the active layer A8 of the output control transistor T8 on the base substrate 10 and the orthographic projection of the first power line VGH on the base substrate 10, and is arranged side by side in the second direction X with the orthographic projection of the active layer of the output control transistor T8 on the base substrate 10, that is, in the second direction X, the second capacitor C2 is located between the active layer A8 of the output control transistor T8 and the first power line VGH. For example, the first capacitor C1 and the second capacitor C2 may partially overlap with the first power line VGH, respectively. The orthographic projection of the first capacitor C1 on the base substrate 10 and the orthographic projection of the second capacitor C2 on the base substrate 10 are arranged side by side in the first direction Y, that is, the first capacitor C1 and the second capacitor C2 are arranged in the first direction Y. For example, in the first direction Y, the second capacitor C2 is located above the first capacitor C1.

Therefore, by arranging the first capacitor C1 and the second capacitor C2 side by side in the first direction Y, the number of devices arranged side by side in the second direction X can be further reduced, so that the space occupied by the first capacitor C1 and the second capacitor C2 in the second direction X can be reduced, furthermore, the size of the shift register unit 105 in the second direction X is compressed to a certain extent, which is conducive to the implementation of the narrow frame design of the display substrate and ensures the display quality of the display substrate at the same time.

For example, as shown in FIG. 2A, FIG. 4, and FIG. 5, the first electrode CE11 of the first capacitor C1 is connected to and formed integrally with the gate electrode G7 of the output transistor T7, thereby forming, for example, a comb-like structure. The second electrode CE21 of the first capacitor C1 is connected to the third transfer electrode 130 through a hole penetrating the third insulating layer 370. The first electrode CE12 of the second capacitor C2 is connected to and integrally formed with the gate electrode G8 of the output control transistor T8, thereby forming, for example, a comb-like structure. The second electrode CE22 of the second capacitor C2 is connected to the first power line VGH through the hole penetrating the third insulating layer 370 to receive the first voltage.

For example, as shown in FIGS. 2A and 3A, the active layer A3 of the third control transistor T3 extends along the second direction X. For example, in conjunction with FIG. 2A, FIG. 2B, and FIG. 3A, a minimum distance in the second direction X between the orthographic projection of the active layer A3 of the third control transistor T3 on the base substrate 10 and the orthographic projections of the first clock signal line ECK and the second clock signal line ECB on the base substrate 10 is a third distance. For example, the third distance D3 is a spacing distance in the second direction X between the orthographic projection of the active layer A3 of the third control transistor T3 on the base substrate 10 and an edge of the side of the first clock signal line ECK close to the display region 102. The difference between the first distance D1 and the third distance D3 is greater than or equal to 0 and less than or equal to twice the size AL1 of the active layer A1 of the first control transistor T1 in the second direction X or twice the size AL3 of the active layer A3 of the third control transistor T3 in the second direction X, that is, $0 \le |D1-D3| \le 2AL1$ or $0 \le |D1-D3| \le 2AL3$. The difference between the second distance D2 and the third distance D3 is greater than or equal to 0 and less than or equal to twice the size AL2 of the active layer A2 of the second control transistor T2 in the second direction X or twice the size AL3 of the active layer A3 of the third control transistor T3 in the second direction X, that is, $0 \le |D2-D3| \le 2AL2$ or $0 \le |D2-D3| \le 2AL3$. For example, AL3 is the length of the active layer A3 of the third control transistor T3 in the second direction X. Thus, the active layer A1 of the first control transistor T1, the active layer A2 of the second control transistor T2, and the active layer A3 of the third control transistor T3 are arranged side by side in the first direction Y.

For example, the orthographic projection of the active layer A3 of the third control transistor T3 on the base substrate 10 is located on the side of the orthographic projections of the first clock signal line ECK and the second clock signal line ECB on the base substrate 10 close to the display region 102. For example, the orthographic projection of the active layer A3 of the third control transistor T3 on the base substrate 10 is located on the side of the orthographic projection of the active layer A2 of the second control transistor T2 on the base substrate 10 away from the orthographic projection of the active layer A1 of the first control transistor T1 on the base substrate 10. That is, the active layer A1 of the first control transistor T1, the active layer A2 of the second control transistor T2, and the active layer A3 of the third control transistor T3 are sequentially arranged in the first direction Y from top to bottom.

Thus, by arranging the active layer A1 of the first control transistor T1, the active layer A2 of the second control transistor T2, and the active layer A3 of the third control transistor T3 side by side in the first direction Y, the size of the active layer A1 of the first control transistor T1, the size of the active layer A2 of the second control transistor T2, and the size of the active layer A3 of the third control transistor T3 in the second direction X can be reduced, and therefore, the layout design of the first control transistor T1, the second control transistor T2, and the third control transistor T3 in the shift register unit 105 is optimized. Furthermore, the size of the shift register unit 105 in the second direction X is reduced to a certain extent, the space required by the shift register unit 105 in the peripheral region 106 of the display substrate is reduced, which is beneficial to achieve the narrow frame design of the display substrate and ensure the display quality of the display substrate as the same time. In addition, more sufficient space can be reserved for other transistors, capacitors, wires, etc. in the shift register unit 105, so that the wiring connection and the structural layout of the shift register unit 105 can be further optimized.

For example, as shown in FIGS. 2A and 4, the gate electrode G1 of the first control transistor T1, the gate electrode G2 of the second control transistor T2, and the gate electrode G3 of the third control transistor T3 are parallel to each other in the first direction Y. That is, the gate electrode G1 of the first control transistor T1, the gate electrode G2 of the second control transistor T2, and the gate electrode G3 of the third control transistor T3 are sequentially arranged in the first direction Y from top to bottom. Thus, the size of the first control transistor T1, the size of the second control transistor T2, and the size of the third control transistor T3 in the second direction X are further reduced, and the layout design of the first control transistor T1, the second control transistor T2, and the third control transistor T3 in the shift register unit 105 is optimized.

For example, as shown in FIGS. 2A and 4, the orthographic projection of the third capacitor C3 on the base substrate 10 is located between the orthographic projection of the active layer A3 of the third control transistor T3 on the base substrate 10 and the orthographic projection of the active layer A2 of the second control transistor T2 on the base substrate 10 in the first direction Y. That is, in the first direction Y, the third capacitor C3 is located between the active layer A3 of the third control transistor T3 and the active layer A2 of the second control transistor T2, thereby further reducing the size of the shift register unit 105 in the second direction X to a certain extent.

For example, as shown in FIG. 2A, FIG. 4, FIG. 5, and FIG. 7, the first transfer electrode 110 further includes a second sub-portion 112 extending along the second direction X, an end of the second sub-portion 112 of the first transfer electrode 110 is connected to the first electrode CE13 of the third capacitor C3 through a hole penetrating the second insulating layer 360 and the third insulating layer 370. The first electrode CE13 of the third capacitor C3 is connected to and is formed integrally with the gate electrode G3 of the third control transistor T3, and the second electrode CE23 of the third capacitor C3 is connected to and is formed integrally with the electrode connection wire M1, thereby simplifying the manufacturing process of the display substrate and reducing the manufacturing cost. The electrode connection wire M1 extends along the second direction X. A first end M11 of the electrode connection wire M1 is connected to the first clock signal line ECK through a hole penetrating the third insulating layer 370 to receive the first clock signal; a second end M12 of the electrode connection wire M1 is connected to the second electrode CE23 of the third capacitor C3 to transmit the first clock signal provided by the first clock signal line ECK. The display substrate further includes a fourth transfer electrode 140, and the fourth transfer electrode 140 extends along the first direction Y to reduce the size occupied by the fourth transfer electrode 140 in the second direction X. A first end 141 of the fourth transfer electrode 140 is connected to the second end M12 of the electrode connection wire M1 through a hole penetrating the third insulating layer 370, and a second end 142 of the fourth transfer electrode 140 is connected to the first electrode of the third control transistor T3, and is, for example, preferably formed integrally with the first electrode of the third control transistor T3. Thus, the first clock signal provided by the first clock signal line ECK is transmitted through the fourth transfer electrode 140 and the electrode connection wire M1.

For example, as shown in FIGS. 2A and 3A, the active layer A4 of the fourth control transistor T4 extends along the second direction X, and the orthographic projection of the active layer A4 of the fourth control transistor T4 on the base substrate 10 is located on a side of the orthographic projection of the active layer A3 of the third control transistor T3 on the base substrate 10 away from the orthographic projection of the active layer A2 of the second control transistor T2 on the base substrate 10 in the first direction Y.

For example, in conjunction with FIG. 2A, FIG. 2B, and FIG. 3A, a minimum distance in the second direction X between the orthographic projection of the active layer A4 of the fourth control transistor T4 on the base substrate 10 and the orthographic projections of the first clock signal line ECK and the second clock signal line ECB on the base substrate 10 is a fourth distance D4. For example, the fourth distance D4 is a spacing distance in the second direction X between the orthographic projection of the active layer A4 of the fourth control transistor T4 on the base substrate 10 and an edge of the side of the first clock signal line ECK close to the display region 102. The difference between the third distance D3 and the fourth distance D4 is greater than or equal to 0 and less than or equal to the size AL3 of the active layer A3 of the third control transistor T3 in the second direction X or the size AL4 of the active layer A4 of the fourth control transistor T4 in the second direction X, that is, $0 \leq |D3-D4| \leq AL3$ or $0 \leq |D3-D4| \leq AL4$. For example, AL4 is the length of the active layer A4 of the fourth control transistor T4 in the second direction X. Thus, the active layer A2 of the second control transistor T2, the active layer A3 of the third control transistor T3, and the active layer A4 of the fourth control transistor T4 are sequentially arranged in the first direction Y from top to bottom, thereby further optimizing the layout structure of the second control transistor T2, the third control transistor T3, and the fourth control transistor T4 in the display substrate, and reducing the size of the shift register unit 105 in the second direction X to a certain extent.

For example, as shown in FIG. 2A, FIG. 4, and FIG. 7, the display substrate further includes a fifth transfer electrode 150 and a second connection wire L2. The fifth transfer electrode 150 extends along the second direction X, a first end 151 of the fifth transfer electrode 150 is connected to the second electrode of the third control transistor T3, and is, for example, preferably formed integrally with the second electrode of the third control transistor T3, and a second end 152 of the fifth transfer electrode 150 is connected to the first electrode of the fourth control transistor T4, and is, for example, preferably formed integrally with the first electrode of the fourth control transistor T4. A first end L21 of the second connection wire L2 is connected to the fifth transfer electrode 150 through a hole penetrating the second insulating layer 360 and the third insulating layer 370, and a second end L22 of the second connection wire L2 is connected to the gate electrode G8 of the output control transistor T8. The second connection wire L2 can be formed integrally with the gate electrode G8 of the output control transistor T8 to simplify the manufacturing process of the display substrate. The second electrode of the fourth control transistor T4 is connected to the first power line transfer electrode 180, and is, for example, preferably formed integrally with the first power line transfer electrode 180, to receive the first voltage.

For example, as shown in FIGS. 2A and 3A, the active layer A6 of the input transistor T6 and the active layer A5 of the fifth control transistor T5 respectively extend along the first direction Y and are arranged side by side in the second direction X, thereby reducing the size of the active layer A6 of the input transistor T6 and the size of the active layer A5 of the fifth control transistor T5 in the second direction X. The orthographic projection of the active layer A6 of the input transistor T6 on the base substrate 10 and the orthographic projection of the active layer A5 of the fifth control transistor T5 on the base substrate 10 are located on the side of the orthographic projection of the active layer A4 of the fourth control transistor T4 on the base substrate 10 away from the orthographic projection of the active layer A3 of the third control transistor T3 on the base substrate 10. That is, the active layer A6 of the input transistor T6 and the active layer A5 of the fifth control transistor T5 are located below the active layer A4 of the fourth control transistor T4 in the first direction Y.

For example, in conjunction with FIG. 2A, FIG. 2B, and FIG. 3A, a minimum distance in the second direction X between the orthographic projection of the active layer A6 of the input transistor T6 on the base substrate 10 and the orthographic projections of the first clock signal line ECK and the second clock signal line ECB on the base substrate 10 is a fifth distance D5. For example, the fifth distance D5 is a spacing distance in the second direction X between the orthographic projection of the active layer A6 of the input transistor T6 on the base substrate 10 and an edge of the side of the first clock signal line ECK close to the display region 102. A difference between the fourth distance D4 and the fifth distance D5 is greater than or equal to 0 and less than or equal to 1.5 times the size of the active layer A4 of the fourth control transistor T4 in the second direction X, that is, $0 \leq |D4-D5| \leq 1.5 AL4$. Therefore, the layout setting of the input transistor T6 in the first direction Y and the second direction X is further optimized.

For example, in conjunction with FIGS. 2A, 2B and 3A, a minimum distance in the first direction Y between the orthographic projection of the active layer A6 of the input transistor T6 on the base substrate 10 and the orthographic projection of the active layer A4 of the fourth control transistor T4 on the base substrate 10 is a sixth distance D6, and a minimum distance in the first direction Y between the orthographic projection of the active layer A5 of the fifth control transistor T5 on the base substrate 10 and the orthographic projection of the active layer A4 of the fourth control transistor T4 on the base substrate 10 is a seventh distance D7. A difference between the sixth distance D6 and the seventh distance D7 is greater than or equal to 0 and less than or equal to the size AL6 of the active layer A6 of the input transistor T6 in the first direction Y or the size AL5 of the active layer A5 of the fifth control transistor T5 in the first direction Y, that is, $0 \leq |D6-D7| \leq AL5$ or $0 \leq |D6-D7| \leq AL6$. For example, AL5 is the length of the active layer A5 of the fifth control transistor T5 in the first direction Y, and AL6 is the length of the active layer A6 of the input transistor T6 in the first direction Y. Therefore, the layout settings of the fifth control transistor T5 and the input transistor T6 in the first direction Y is further optimized.

For example, in some other embodiments of the present disclosure, as shown in FIG. 3B, the active layer A6 of the input transistor T6 and the active layer A5 of the fifth control transistor T5 may also extend along the second direction X and be arranged side by side in the first direction Y, as a result, the active layer A1 of the first control transistor T1, the active layer A2 of the second control transistor T2, the active layer A3 of the third control transistor T3, the active layer A4 of the fourth control transistor T4, the active layer A6 of the input transistor T6, and the active layer A5 of the fifth control transistor T5 in the shift register unit 105 extend along the second direction X and are arranged in sequence in the first direction Y, thereby simplifying the manufacturing process of the display substrate, for example, simplifying the manufacturing process of the active layer of the display substrate and reducing the manufacturing cost.

For example, in the case where the active layer A6 of the input transistor T6 and the active layer A5 of the fifth control transistor T5 respectively extend along the second direction X, the active layer A6 of the input transistor T6 may be located above the active layer A5 of the fifth control transistor T5 as shown in FIG. 3B, that is, the orthographic projection of the active layer A5 of the fifth control transistor T5 on the base substrate 10 is located on the side of the orthographic projection of the active layer A6 of the input transistor T6 on the base substrate 10 away from the orthographic projection of the active layer A4 of the fourth control transistor T4 on the base substrate 10; alternatively, the active layer A6 of the input transistor T6 may also be located below the active layer A5 of the fifth control transistor T5, that is, the orthographic projection of the active layer A5 of the fifth control transistor T5 on the base substrate 10 is located on the side of the orthographic projection of the active layer A6 of the input transistor T6 on the base substrate 10 close to the orthographic projection of the active layer A4 of the fourth control transistor T4 on the base substrate 10, and the embodiments of the present disclosure are not limited to this case.

For example, as shown in FIG. 2A, FIG. 4, and FIG. 7, the display substrate further includes a sixth transfer electrode 160, a seventh transfer electrode 170, a third connection wire L3, and a fourth connection wire L4. The first electrode of the input transistor T6 is connected to the first end 161 of the sixth transfer electrode 160, and is, for example, preferably formed integrally with the first end 161 of the sixth transfer electrode 160, and the second electrode of the input transistor T6 is connected to the second transfer electrode 120, and is preferably formed integrally with the second transfer electrode 120, for example. The third connection wire L3 extends along the second direction X, a first end L31 of the third connection wire L3 is connected to the first clock signal line ECK through a hole penetrating the second insulating layer 360 and the third insulating layer 370 to receive the first clock signal provided by the first clock signal line ECK. A second end L32 of the third connection wire L3 is connected to the gate electrode G6 of the input transistor T6 to transmit the first clock signal. The third connection wire L3 is formed integrally with the gate electrode G6 of the input transistor T6, thereby simplifying the manufacturing process of the display substrate and reducing the manufacturing cost. The gate electrode G5 of the fifth control transistor T5 is connected to the second power line transfer electrode 190 through a hole penetrating the second insulating layer 360 and the third insulating layer 370 to receive the second voltage. The first electrode of the fifth control transistor T5 is connected to the second end 162 of the sixth transfer electrode 160, and is, for example, preferably formed integrally with the second end 162 of the sixth transfer electrode 160; the second electrode of the fifth control transistor T5 is connected to the first end 171 of the seventh transfer electrode 170, and is, for example, preferably formed integrally with the first end 171 of the seventh transfer electrode 170, the second end 172 of the seventh transfer electrode 170 is connected to the first end L41 of the fourth connection wire L4 through a hole penetrating the second insulating layer 360 and the third insulating layer 370, and the second end L42 of the fourth connection wire L4 is connected to the gate electrode G7 of the output transistor T7. For example, the fourth connection wire L4 can be formed integrally with the gate electrode G7 of the output transistor T7 to simplify the manufacturing process.

For example, as shown in FIG. 7, the sixth transfer electrode 160 extends along the second direction X, so that the layout design between the first electrode of the fifth control transistor T5 and the first electrode of the input transistor T6 can be optimized.

For example, in some embodiments of the present disclosure, the display substrate further includes a gate drive circuit (not shown in the figure). The gate drive circuit includes a plurality of shift register units that are cascaded. For example, the gate drive circuit is the reset control drive circuit array described above, which includes a plurality of shift register units 105 that are cascaded, so that the reset control signals can be output row by row.

For example, the trigger signal line ESTV is configured to provide a trigger signal to the gate drive circuit, the orthographic projection of the trigger signal line ESTV on the base substrate 10 is located on the side of the orthographic projections of the first clock signal line ECK and the second clock signal line ECB on the base substrate 10 away from the display region 102, that is, in the second direction X, the trigger signal line ESTV is located on the left side of the first clock signal line ECK and the second clock signal line ECB. The trigger signal line ESTV is connected to the input circuit of the first stage of shift register unit of the gate drive circuit to provide a trigger signal as the input signal of the first stage of shift register unit. For specific introduction, please refer to the previous description, which will not be repeated here.

For example, in some embodiments of the present disclosure, the line width of the wire of each layer is generally 3 micrometers, for example, and the spacing distance between the wires on the same layer is, for example, greater than 3 micrometers. For example, the spacing distance between the wires is related to the accuracy of the exposure machine, for example, the higher the accuracy of the exposure machine, the smaller the spacing distance can be, the details can be specifically determined according to the actual situations, and the embodiments of the present disclosure are not limited to this case. In the embodiments of the present disclosure, necessary spacing must be left between the wires in the same layer to avoid the wire adhesion, signal short circuit, etc. in the actual process.

A distance between an orthographic projection of a wire of the first conductive layer 320 on the base substrate 10 and an orthographic projection of a wire of the second conductive layer 330 on the base substrate 10 is generally 1.5 micrometers, for example. For example, a gate electrode of a transistor in the first conductive layer 320 needs to exceed an active layer of the transistor on the semiconductor layer 310 by more than 2 micrometers, for example. For example, as shown in FIGS. 2A, 3A, and 4, the "U"-shaped double gate of the first control transistor T1 extends, in the first direction Y, beyond the active layer of the first control transistor T1 by, for example, more than 2 micrometers on both sides of the active layer of the first control transistor T1, for example, a length of a portion of the "U"-shaped double gate of the first control transistor T1 that does not overlap the active layer of the first control transistor T1 in the first direction Y is 2 micrometers or more, and the embodiments of the present disclosure are not limited to this case.

For example, a spacing distance between an orthographic projection of an active layer of each transistor in the semiconductor layer 310 on the base substrate 10 and an orthographic projection of each gate wire in the first conductive layer 320 on the base substrate 101 is 1.5 micrometers or more, so as to avoid a channel effect between the gate wire and the active layer of each transistor in the semiconductor layer 310 from occurring. For example, the spacing distance between the orthographic projection of the semiconductor layer 310 on the base substrate 10 and the orthographic projection of the second conductive layer 330 on the base substrate 10 is not limited, for example, the orthographic projection of the semiconductor layer 310 on the base substrate 10 and the orthographic projection of the second conductive layer 330 on the base substrate 10 may be overlapped. For example, in some embodiments of the present disclosure, a certain spacing distance between wires in different layers is reserved as much as possible (this spacing distance is smaller than the spacing distance between wires in the same layer), thereby reducing unnecessary overlap, and reducing or avoiding interference caused by excessive parasitic capacitance.

For example, a width of each wire of the third conductive layer 340 should cover (for example, completely cover) a hole corresponding to the wire, for example, the wire may exceed the size of the hole (for example, the diameter of the hole) by more than 1 micron, for example, the size of the hole is 2.0 μm~2.5 μm, and the width of each wire of the third conductive layer 340 that covers the hole is 4 μm~5 μm. For example, the width of the wire, corresponding to the hole, of the output transistor T7 and the output control transistor T8 exceeds the size of the hole by 1 micron above and below, for example, 4.0~4.5 micron. Because the output transistor T7 and the output control transistor T8 correspond to many holes, the width of the wire, connecting other transistors, in the third conductive layer 340 only needs to meet the requirement of covering the hole by more than 1 micron at the position of the hole. For example, the width of the wire between the holes can be relatively narrow.

For example, the spacing distance between the first clock signal line ECK, the second clock signal line ECB, the first power line VGH, and the second power line VGL, and the like located on the third conductive layer 340 is 3 microns or more, in order to meet the driving capability requirement, a line width of the first clock signal line ECK and a line width of the second clock signal line ECB are set to be 9 microns or more, a line width of the first power line VGH and a line width of the second power line VGL can be 6 micrometers, 9 micrometers, or 10 micrometers, or the like. The second voltage provided by the second power line VGL may be −7V, for example.

For example, in some examples, the thickness of the first conductive layer 320 and the thickness of the second conductive layer 330 are 2000~300 angstroms, the thickness of the third conductive layer 340 is 5000~8000 angstroms, and the embodiments of the present disclosure are not limited to this case.

For example, by arranging the above-mentioned transfer electrodes, connection wires, electrode connection wires, etc., problems such as wire adhesion and signal short circuit caused by dense wires in the same layer can be reduced or avoided. For example, the above-mentioned transfer electrodes, connection wires, electrode connection wires, and the like can play a role in connections or jumper connections.

The display substrate provided by the above-mentioned embodiments of the present disclosure optimizes the circuit connection and structural layout of the shift register unit, reduces the size of the shift register unit in the second direction to a certain extent, and reduces the space that the shift register unit needs to occupy in the peripheral region of the display substrate, which is beneficial to achieve the narrow frame design by using the display substrate, and ensure the display quality achieved by using the display substrate.

Figure 9:
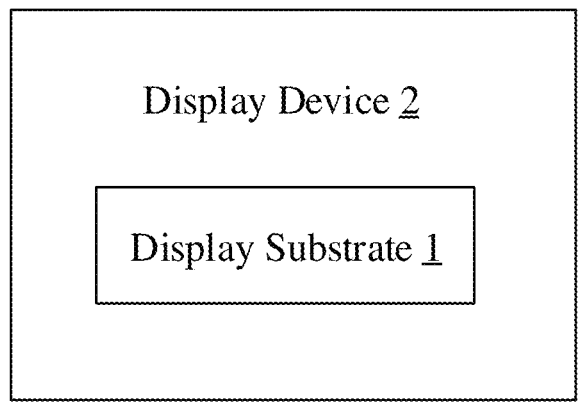
FIG. 9 is a schematic diagram of a display device provided by at least one embodiment of the present disclosure.

At least one embodiment of the present disclosure also provides a display device. FIG. 9 is a schematic diagram of a display device provided by at least one embodiment of the present disclosure. As shown in FIG. 9, the display device 2 includes a display substrate 1, and the display substrate 1 may be a display substrate provided by any embodiment of the present disclosure, for example, the display substrate 1 as shown in FIG. 2 described above.

It should be noted that the display device 2 can be any product or component having a display function, such as an OLED panel, an OLED TV, a QLED panel, a QLED TV, a mobile phone, a tablet computer, a notebook computer, a digital photo frame, a navigator, and the like. The display device 2 may also include other components, such as a data drive circuit, a timing controller, etc., and the embodiments of the present disclosure are not limited to this case.

It should be noted that, for the sake of clarity and conciseness, the embodiments of the present disclosure do not provide all the constituent units of the display device 2. In order to achieve the basic function of the display device 2, those skilled in the art can provide and set other structures not shown according to specific needs, which are not limited in the embodiments of the present disclosure.

Regarding the technical effect of the display device 2 provided by the above-mentioned embodiments, reference may be made to the technical effect of the display substrate (for example, the display substrate shown in FIG. 2A above) provided in the embodiments of the present disclosure, which will not be repeated here.

Figure 10:
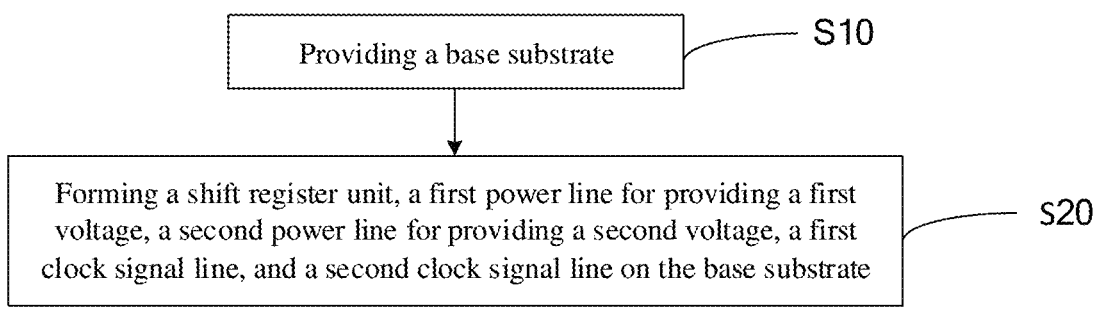
FIG. 10 is a flowchart of a manufacturing method of a display substrate provided by at least one embodiment of the present disclosure.

At least one embodiment of the present disclosure also provides a manufacturing method of a display substrate, for example, the manufacturing method of the display substrate provided by any embodiment of the present disclosure. FIG. 10 is a flowchart of a manufacturing method of a display substrate provided by at least one embodiment of the present disclosure. For example, the manufacturing method can be used to manufacture the display substrate provided by any embodiment of the present disclosure, for example, can be used to manufacture the display substrate as shown in FIG. 2 above.

As shown in FIG. 10, the manufacturing method of the display substrate includes the following steps S10 to S20.

Step S10: providing a base substrate.

Step S20: forming a shift register unit, a first power line for providing a first voltage, a second power line for providing a second voltage, a first clock signal line, and a second clock signal line on the base substrate.

For example, forming a semiconductor layer, a first insulating layer, a first conductive layer, a second insulating layer, a second conductive layer, a third insulating layer, and a third conductive layer respectively includes forming corresponding material layers (for example, a semiconductor material layer, an insulating material layer, or a conductive material layer), and then using a patterning process to form corresponding pattern structures (for example, active layers, electrode patterns, wires, holes, etc.). The patterning process is, for example, a photolithography process, including: coating a photoresist layer on the insulating material that needs to be patterned, using a mask to expose the photoresist layer, developing the exposed photoresist layer to obtain a photoresist pattern, etching the structure layer using the photoresist pattern, and then optionally removing the photoresist pattern.

For example, taking the case of manufacturing the display substrate as shown in FIG. 2A as an example, for step S10, the base substrate 101 can be made of, for example, glass, plastic, quartz, or other suitable materials, and the embodiments of the present disclosure are not limited to this case.

For example, the shift register unit 105, the first power line VGH, the second power line VGL, the first clock signal line ECK, and the second clock signal line ECB are formed on the base substrate 10.

For step S20, for example, forming the shift register unit 105 includes: sequentially forming a semiconductor layer 310, a first insulating layer 350, a first conductive layer 320, a second insulating layer 360, a second conductive layer 330, a third insulating layer 370, and a third conductive layer 340 in a direction perpendicular to the base substrate 10. Active layers of respective transistors are located on the semiconductor layer 310, gate electrodes of the respective transistor and first electrodes of respective capacitors are located on the first conductive layer 320, second electrodes of the respective capacitors are located on the second conductive layer 330, and the first power line VGH, the second power line VGL, the first clock signal line ECK, the second clock signal line ECB, and first electrodes and second electrodes of the respective transistors are on the third conductive layer 340.

For example, the respective transistors and the respective capacitors are connected to each other and are connected to the first power line VGH, the second power line VGL, the first clock signal line ECK, and the second clock signal ECB through holes penetrating the first insulating layer 350, the second insulating layer 360, or the third insulating layer 370.

Regarding the arrangements of the respective transistors and capacitors of the shift register unit 105, the first power line VGH, the second power line VGL, the plurality of clock signal lines, the connection structures, and the like, reference may be made to the corresponding descriptions in the embodiments as shown in FIGS. 2A to 8, which will not be repeated here.

It should be noted that in a plurality of embodiments of the present disclosure, the flow of the manufacturing method of the display substrate may include more or fewer operations, and these operations may be performed sequentially or in parallel. Although the flow of the manufacturing method described above includes a plurality of operations in a specific order, it should be clearly understood that the order of the plurality of operations is not limited. The above-described manufacturing method can be executed once, or executed several times according to predetermined conditions.

Regarding the technical effect of the manufacturing method of the display substrate provided by the above embodiments, reference may be made to the technical effect of the display substrate (for example, the display substrate shown in FIG. 2A above) provided in the embodiments of the present disclosure, and details are not described herein again.

The following should be noted:

(1) Only the structures involved in the embodiments of the present disclosure are illustrated in the drawings of the embodiments of the present disclosure, and other structures can refer to usual designs;

(2) The embodiments and features in the embodiments of the present disclosure may be combined in case of no conflict to acquire new embodiments.

What have been described above merely are exemplary embodiments of the present disclosure, and not intended to define the scope of the present disclosure, and the scope of the present disclosure is determined by the appended claims.

What is claimed is:

1. A display substrate, comprising:
a base substrate, comprising a display region and a peripheral region on at least one side of the display region; and
a shift register unit, a first clock signal line, and a second clock signal line, on the peripheral region of the base substrate,
wherein the first clock signal line and the second clock signal line extend along a first direction on the base substrate, and the first clock signal line and the second clock signal line are configured to respectively provide a first clock signal or a second clock signal to the shift register unit;
the shift register unit comprises a first control transistor, a second control transistor, and a third control transistor;
an active layer of the first control transistor, an active layer of the second control transistor, and an active layer of the third control transistor respectively extend along a second direction that is different from the first direction;
an orthographic projection of the active layer of the first control transistor on the base substrate, an orthographic projection of the active layer of the second control transistor on the base substrate, and an orthographic projection of the active layer of the third control transistor on the base substrate are on a side of orthographic projections of the first clock signal line and the second clock signal line on the base substrate close to the display region;
a minimum distance in the second direction between the orthographic projection of the active layer of the first control transistor on the base substrate and the orthographic projections of the first clock signal line and the second clock signal line on the base substrate is a first distance;
a minimum distance in the second direction between the orthographic projection of the active layer of the second control transistor on the base substrate and the orthographic projections of the first clock signal line and the second clock signal line on the base substrate is a second distance;
a minimum distance in the second direction between the orthographic projection of the active layer of the third control transistor on the base substrate and the orthographic projections of the first clock signal line and the second clock signal line on the base substrate is a third distance;
a difference between the first distance and the second distance is greater than or equal to 0 and is less than or equal to a size of the active layer of the first control transistor in the second direction or a size of the active layer of the second control transistor in the second direction;
a difference between the first distance and the third distance is greater than or equal to 0 and is less than or equal to 2 times the size of the active layer of the first control transistor in the second direction or 2 times a size of the active layer of the third control transistor in the second direction; and
a difference between the second distance and the third distance is greater than or equal to 0 and is less than or equal to 2 times the size of the active layer of the second control transistor in the second direction or 2 times the size of the active layer of the third control transistor in the second direction.

2. The display substrate according to claim 1, wherein a range of the first distance is 40 μm~55 μm, and a range of the second distance is 40 μm~55 μm.

3. The display substrate according to claim 2, wherein the first distance is 40 μm, 42 μm, 44 μm, 45 μm, or 50 μm, and the second distance is 40 μm, 42 μm, 44 μm, 45 μm, or 50 μm.

4. The display substrate according to claim 1, wherein a gate electrode of the first control transistor, a gate electrode of the second control transistor, and a gate electrode of the third control transistor are parallel to each other in the first direction;
the gate electrode of the first control transistor comprises a main body portion extending along the second direction and two sub-gate electrodes, which are parallel to each other, extending from the main body portion of the gate electrode of the first control transistor; and
the gate electrode of the second control transistor comprises a main body portion extending along the second direction and two sub-gate electrodes, which are parallel to each other, extending from the main body portion of the gate electrode of the second control transistor.

5. The display substrate according to claim 1, wherein the orthographic projection of the active layer of the third control transistor on the base substrate is on a side of the orthographic projection of the active layer of the second control transistor on the base substrate away from the orthographic projection of the active layer of the first control transistor on the base substrate.

6. The display substrate according to claim 5, wherein the shift register unit comprises an input circuit, a first node control circuit, a second node control circuit, a second node noise reduction circuit, a third node control circuit, an output control circuit, and an output circuit;
the first node control circuit is configured to input a first voltage to a first node under control of an input signal and the second clock signal;
the second node control circuit is configured to input the first clock signal to a second node in response to a level of the first node;
the output control circuit is configured to output the first voltage to an output terminal in response to a level of the second node;
the input circuit is configured to input the input signal to a fourth node in response to the first clock signal;
the second node noise reduction circuit is configured to input the first voltage to the second node in response to a level of the fourth node, so as to perform noise reduction on the second node;
the third node control circuit is configured to control a level of a third node under control of a second voltage; and
the output circuit is configured to output the second voltage to the output terminal in response to the level of the third node, wherein the first node control circuit comprises the first control transistor and the second control transistor, and the second node control circuit comprises the third control transistor.

7. The display substrate according to claim 6, further comprising a first connection wire,
wherein the first connection wire extends along the second direction, and an orthographic projection of the first connection wire on the base substrate is on a side of an orthographic projection of a gate electrode of the second control transistor on the base substrate away from the display region;
a first end of the first connection wire is connected to the gate electrode of the second control transistor, and a second end of the first connection wire is connected to the second clock signal line through a hole penetrating an insulating layer; and
the first connection wire and the gate electrode of the second control transistor are integrally formed.

8. The display substrate according to claim 6, further comprising a first transfer electrode,
wherein the first transfer electrode comprises a first sub-portion extending along the first direction; and
a first end of the first sub-portion of the first transfer electrode is connected to a second electrode of the first control transistor, and a second end of the first sub-portion of the first transfer electrode is connected to a second electrode of the second control transistor.

9. The display substrate according to claim 8, further comprising a first power line that provides the first voltage and a first power line transfer electrode,
wherein the first power line extends along the first direction, an orthographic projection of the first power line on the base substrate is on a side of the orthographic projection of the active layer of the first control transistor on the base substrate and the orthographic projection of the active layer of the second control transistor on the base substrate close to the display region;
the first power line transfer electrode and the first power line are connected to each other and are formed integrally; and
a first electrode of the first control transistor and a first electrode of the second control transistor are respectively connected to the first power line through the first power line transfer electrode;
a ratio between a width of the first power line in the second direction and a width of the first clock signal line in the second direction is greater than or equal to 1.2 and less than or equal to 3; and
a ratio between the width of the first power line in the second direction and a width of the second clock signal line in the second direction is greater than or equal to 1.2 and less than or equal to 3.

10. The display substrate according to claim 9, further comprising a second transfer electrode,
wherein an orthographic projection of the second transfer electrode on the base substrate is on a side of the orthographic projection of the active layer of the first control transistor on the base substrate and the orthographic projection of the active layer of the second control transistor on the base substrate away from the display region;
the second transfer electrode extends along the first direction and is connected to a gate electrode of the first control transistor through a hole penetrating an insulating layer; and the second transfer electrode is connected to a trigger signal line or an output terminal of a previous stage of shift register unit to receive the input signal.

11. The display substrate according to claim 10, wherein the output circuit comprises an output transistor, and the output control circuit comprises an output control transistor,
wherein an orthographic projection of an active layer of the output transistor on the base substrate and an orthographic projection of an active layer of the output control transistor on the base substrate are on a side of the orthographic projection of the active layer of the first control transistor on the base substrate and the orthographic projection of the active layer of the second control transistor on the base substrate close to the display region, and is on a side of the orthographic projection of the first power line on the base substrate away from the display region.

12. The display substrate according to claim 11, further comprising at least one common semiconductor pattern,
wherein the active layer of the output transistor and the active layer of the output control transistor are different portions of the at least one common semiconductor pattern, respectively;
the at least one common semiconductor pattern comprises a plurality of common semiconductor patterns, and the plurality of common semiconductor patterns are spaced apart from each other and arranged in parallel in the second direction.

13. The display substrate according to claim 11, wherein a gate electrode of the output transistor comprises a plurality of sub-gate electrodes connected in parallel, and the plurality of sub-gate electrodes of the output transistor are parallel to each other in the first direction; and
a gate electrode of the output control transistor comprises a plurality of sub-gate electrodes connected in parallel, and the plurality of sub-gate electrodes of the output control transistor are parallel to each other in the first direction.

14. The display substrate according to claim 11, further comprising a second power line that provides the second voltage, a second power line transfer electrode, and a third transfer electrode,
wherein the second power line extends along the first direction, and an orthographic projection of the second power line on the base substrate is on a side of the orthographic projection of the active layer of the first control transistor on the base substrate and the orthographic projection of the active layer of the second control transistor on the base substrate away from the display region;
the second power line transfer electrode and the second power line are connected to each other and are formed integrally;
a first electrode of the output transistor is connected to the second power line through the second power line transfer electrode, and a second electrode of the output transistor is connected to the third transfer electrode;
a first electrode of the output control transistor is connected to the first power line through the first power line transfer electrode, and a second electrode of the output control transistor is connected to the third transfer electrode; and
the output terminal comprises the third transfer electrode;
a ratio between a width of the second power line in the second direction and a width of the first clock signal line in the second direction is greater than or equal to 1.2 and less than or equal to 3;

a ratio between the width of the second power line in the second direction and a width of the second clock signal line in the second direction is greater than or equal to 1.2 and less than or equal to 3; and an orthographic projection of the second power line on the base substrate is on a side of orthographic projections of the first clock signal line and the second clock signal line on the base substrate close to the display region.

15. The display substrate according to claim 14, wherein the output circuit further comprises a first capacitor, and the output control circuit further comprises a second capacitor;

an orthographic projection of the first capacitor on the base substrate is between an orthographic projection of the active layer of the output transistor on the base substrate and the orthographic projection of the first power line on the base substrate, and the orthographic projection of the first capacitor on the base substrate and the orthographic projection of the active layer of the output transistor on the base substrate are arranged side by side in the second direction;

an orthographic projection of the second capacitor on the base substrate is between an orthographic projection of the active layer of the output control transistor on the base substrate and the orthographic projection of the first power line on the base substrate, and the orthographic projection of the second capacitor on the base substrate and the orthographic projection of the active layer of the output control transistor on the base substrate are arranged side by side in the second direction; and the orthographic projection of the first capacitor on the base substrate and the orthographic projection of the second capacitor on the base substrate are arranged side by side in the first direction;

a first electrode of the first capacitor and a gate electrode of the output transistor are connected to each other and are formed integrally, and a second electrode of the first capacitor is connected to the third transfer electrode through a hole penetrating an insulating layer; and a first electrode of the second capacitor and a gate electrode of the output control transistor are connected to each other and are formed integrally, and a second electrode of the second capacitor is connected to the first power line through a hole penetrating the insulating layer.

16. The display substrate according to claim 14, wherein the second node control circuit further comprises a third capacitor; and an orthographic projection of the third capacitor on the base substrate is between, in the first direction, the orthographic projection of the active layer of the third control transistor on the base substrate and the orthographic projection of the active layer of the second control transistor on the base substrate;

the display substrate further comprises an electrode connection wire and a fourth transfer electrode, wherein the first transfer electrode further comprises a second sub-portion extending along the second direction, and an end of the second sub-portion of the first transfer electrode is connected to a first electrode of the third capacitor through a hole penetrating an insulating layer;

the first electrode of the third capacitor and a gate electrode of the third control transistor are connected to each other and are integrally formed, and a second electrode of the third capacitor and the electrode connection wire are connected to each other and are integrally formed;

the electrode connection wire extends along the second direction, a first end of the electrode connection wire is connected to the first clock signal line through a hole penetrating the insulating layer, and a second end of the electrode connection wire is connected to the second electrode of the third capacitor; and the fourth transfer electrode extends along the first direction, a first end of the fourth transfer electrode is connected to the second end of the electrode connection wire through a hole penetrating the insulating layer, and a second end of the fourth transfer electrode is connected to a first electrode of the third control transistor.

17. The display substrate according to claim 14, wherein the second node noise reduction circuit comprises a fourth control transistor;

an active layer of the fourth control transistor extends along the second direction;

an orthographic projection of the active layer of the fourth control transistor on the base substrate is on a side of the orthographic projection of the active layer of the third control transistor on the base substrate away from the orthographic projection of the active layer of the second control transistor on the base substrate in the first direction;

a minimum distance in the second direction between the orthographic projection of the active layer of the fourth control transistor on the base substrate and the orthographic projections of the first clock signal line and the second clock signal line on the base substrate is a fourth distance; and a difference between the third distance and the fourth distance is greater than or equal to 0 and less than or equal to the size of the active layer of the third control transistor in the second direction or a size of the active layer of the fourth control transistor in the second direction.

18. The display substrate according to claim 17, further comprising a fifth transfer electrode and a second connection wire, wherein the fifth transfer electrode extends along the second direction, a first end of the fifth transfer electrode is connected to a second electrode of the third control transistor, and a second end of the fifth transfer electrode is connected to a first electrode of the fourth control transistor;

a first end of the second connection wire is connected to the fifth transfer electrode through a hole penetrating an insulating layer, and a second end of the second connection wire is connected to a gate electrode of the output control transistor;

the second connection wire is formed integrally with the gate electrode of the output control transistor; and a second electrode of the fourth control transistor is connected to the first power line transfer electrode.

19. The display substrate according to claim 17, wherein the input circuit comprises an input transistor, and the third node control circuit comprises a fifth control transistor, an active layer of the input transistor and an active layer of the fifth control transistor respectively extend along the first direction and are arranged side by side in the second direction;

an orthographic projection of the active layer of the input transistor on the base substrate and an orthographic projection of the active layer of the fifth control transistor on the base substrate are on a side of the orthographic projection of the active layer of the fourth control transistor on the base substrate away from the orthographic projection of the active layer of the third control transistor on the base substrate;

a minimum distance in the second direction between the orthographic projection of the active layer of the input transistor on the base substrate and the orthographic projections of the first clock signal line and the second clock signal line on the base substrate is a fifth distance;

a difference between the fourth distance and the fifth distance is greater than or equal to 0 and less than or equal to 1.5 times the size of the active layer of the fourth control transistor in the second direction;

a minimum distance in the first direction between the orthographic projection of the active layer of the input transistor on the base substrate and the orthographic projection of the active layer of the fourth control transistor on the base substrate is a sixth distance;

a minimum distance in the first direction between the orthographic projection of the active layer of the fifth control transistor on the base substrate and the orthographic projection of the active layer of the fourth control transistor on the base substrate is a seventh distance; and a difference between the sixth distance and the seventh distance is greater than or equal to 0 and less than or equal to a size of the active layer of the input transistor in the first direction or a size of the active layer of the fifth control transistor in the first direction.

20. The display substrate according to claim 19, further comprising a third connection wire, a fourth connection wire, a sixth transfer electrode, a seventh transfer electrode, a trigger signal line and a gate drive circuit, wherein a first electrode of the input transistor is connected to a first end of the sixth transfer electrode, and a second electrode of the input transistor is connected to the second transfer electrode;

the third connection wire extends along the second direction, a first end of the third connection wire is connected to the first clock signal line through a hole penetrating an insulating layer, and a second end of the third connection wire is connected to a gate electrode of the input transistor;

the third connection wire and the gate electrode of the input transistor are formed integrally;

a gate electrode of the fifth control transistor is connected to the second power line transfer electrode through a hole penetrating the insulating layer, a first electrode of the fifth control transistor is connected to a second end of the sixth transfer electrode, and a second electrode of the fifth control transistor is connected to a first end of the seventh transfer electrode; and a second end of the seventh transfer electrode is connected to a first end of the fourth connection wire through a hole penetrating the insulating layer, a second end of the fourth connection wire is connected to a gate electrode of the output transistor, and the fourth connection wire and the gate electrode of the output transistor are formed integrally, wherein the sixth transfer electrode extends along the second direction;

the gate drive circuit comprises a plurality of shift register units that are cascaded;

the trigger signal line is configured to provide a trigger signal to the gate drive circuit;

an orthographic projection of the trigger signal line on the base substrate is on a side of an orthographic projection of the first clock signal line on the base substrate and an orthographic projection of the second clock signal line on the base substrate away from the display region; and the trigger signal line is connected to the input circuit of a first stage of shift register unit of the gate drive circuit to provide the trigger signal as an input signal of the first stage of shift register unit.

\* \* \* \* \*